(12) United States Patent
Hatakeyama et al.

(10) Patent No.: US 7,105,267 B2
(45) Date of Patent: Sep. 12, 2006

(54) RESIST COMPOSITIONS AND PATTERNING PROCESS

(75) Inventors: Jun Hatakeyama, Nakakubiki-gun (JP); Youichi Ohsawa, Nakakubiki-gun (JP); Tomohiro Kobayashi, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 385 days.

(21) Appl. No.: 10/226,286

(22) Filed: Aug. 23, 2002

(65) Prior Publication Data

US 2003/0113659 A1 Jun. 19, 2003

(30) Foreign Application Priority Data

Aug. 24, 2001 (JP) .............................. 2001-254293

(51) Int. Cl.
*G03F 7/004* (2006.01)
(52) U.S. Cl. .................. 430/270.1; 430/326; 430/905; 430/907; 430/914; 430/921
(58) Field of Classification Search ............. 430/270.1, 430/326, 914, 921, 905, 907
See application file for complete search history.

(56) References Cited

U.S. PATENT DOCUMENTS 5,744,537 A 4/1998 Brunsvold et al.
6,238,842 B1 * 5/2001 Sato et al. ................ 430/281.1
6,492,091 B1 * 12/2002 Kodama et al. .......... 430/270.1
2002/0102491 A1 * 8/2002 Kodama et al. .......... 430/270.1
2002/0197558 A1 12/2002 Ferreira et al.
2004/0106740 A1 * 6/2004 Kanamori et al. ....... 525/326.5

FOREIGN PATENT DOCUMENTS

| DE | 295 421 A5 | 10/1991 |
| EP | 1179750 A1 * | 2/2002 |
| EP | 1199603 A1 * | 4/2002 |
| JP | 07028237 | 7/1993 |
| JP | 07025846 | 1/1995 |
| JP | 08027102 | 1/1996 |
| JP | 10319581 | 12/1998 |
| JP | 2002-131879 | 5/2002 |
| JP | 2002139838 A * | 5/2002 |
| JP | 2002327024 A * | 11/2002 |

OTHER PUBLICATIONS

English Language abstract of DE 295421.*

* cited by examiner

*Primary Examiner*—Amanda Walke
(74) *Attorney, Agent, or Firm*—Millen, White, Zelano & Branigan, P.C.

(57) ABSTRACT

In a resist composition comprising a base resin which is a high molecular weight structure free from an aromatic substituent group, a photoacid generator, and a solvent, the photoacid generator is a one capable of generating a perfluoroalkyl ether sulfonic acid. The resist composition has many advantages including excellent resolution, minimized size difference between isolated and densely packed patterns, and minimized line edge roughness.

25 Claims, 1 Drawing Sheet

RESIST COMPOSITIONS AND PATTERNING PROCESS

This invention relates to a resist composition comprising an onium salt capable of generating a specific sulfonic acid as the photoacid generator, for use with radiation having a wavelength of up to 200 nm, especially ArF excimer laser light, $F_2$ laser light, EUV, x-ray and electron beam (EB), and a patterning process using the same.

BACKGROUND OF THE INVENTION

While a number of recent efforts are being made to achieve a finer pattern rule in the drive for higher integration and operating speeds in LSI devices, DUV and VUV lithography is thought to hold particular promise as the next generation in microfabrication technology. In particular, it is strongly desired that photolithography using an ArF excimer laser as the light source reach the practical level as the micropatterning technique capable of achieving a feature size of 0.13 µm or less and that photolithography using an $F_2$ laser as the light source reach the practical level as the micropatterning technique capable of achieving a feature size of 0.1 µm or less.

In the photolithography using an ArF excimer laser (wavelength 193 nm), as the light source, a high sensitivity resist material capable of achieving a high resolution at a small dose of exposure is needed to prevent the degradation of precise and expensive optical system materials. Among several measures for providing a high sensitivity resist material, and the most common is to select each component which is highly transparent at the wavelength of 193 nm. For example, polyacrylic acid and derivatives thereof, norbornene-maleic anhydride alternating copolymers, polynorbornene and metathesis ring-opening polymers have been proposed as the base resin. This choice is effective in that the transparency of a resin alone is increased. However, the photoacid generator has the problem that increasing its transparency leads to a drop of acid generation efficiency, resulting in a low sensitivity or the lack of thermal stability and storage stability. There is available no photoacid generator which is practically acceptable.

For example, JP-A 7-25846, JP-A 7-28237 and JP-A 8-27102 disclose alkylsulfonium salts which are highly transparent, but unsatisfactory in acid generation efficiency and thermal stability. JP-A 10-319581 discloses alkylarylsulfonium salts which have a high sensitivity and a good balance of transparency and acid generation efficiency, but lack thermal stability and storage stability. Arylsulfonium salts, which are regarded effective in photolithography using a KrF excimer laser, are good in acid generation efficiency, thermal stability and storage stability, but very low transparent to ArF excimer laser light so that the pattern resulting from exposure and development is noticeably tapered. The lack of transparency can be compensated for by thinning the resist film, but such a thin resist film has extremely low etch resistance. This is inadequate as the pattern forming process.

Onium salts are widely used as the photoacid generator. They are neutralized salts between a sulfonium or iodonium cation having an alkyl or aryl group bonded thereto and an anion. Upon exposure to light, the cation is dissociated and the anion is released as an acid. Illustrated in the above-referred patent publications are structures on the cation side of onium salts. It was reported that with respect to resolution and pattern shape, the type of acid generated or anion is closely correlated to the type of acid labile group. Illustratively, regarding those resists based on polyhydroxystyrene and polyhydroxystyrene/(meth)acrylate copolymers, a number of studies using a variety of acids have been reported. For example, U.S. Pat. No. 5,744,537 discloses that a satisfactory pattern shape is obtainable when a photoacid generator capable of generating camphorsulfonic acid is added. However, alicyclic structure-bearing polymers adapted for ArF and $F_2$ laser exposure have a low reactivity for acid elimination. Even when such polymers have the same acid-eliminatable group as the polyhydroxystyrene and polyhydroxystyrene/(meth)acrylate copolymer, elimination reaction does not proceed with camphorsulfonic acid.

On the anion side of onium salts, fluorinated alkyl sulfonic acids having a high acidity are often applied. Illustrative fluorinated alkyl sulfonic acids include trifluoromethanesulfonic acid, nonafluorobutanesulfonic acid, and hexadecafluorooctanesulfonic acid. Also included are fluoro-substituted or fluoroalkyl-substituted arylsulfonic acids. Examples include 4-fluorobenzenesulfonic acid, 3-benzenesulfonic acid, 2-benzenesulfonic acid, 2,4-difluorobenzenesulfonic acid, 2,3-difluorobenzenesulfonic acid, 3,4-difluorobenzenesulfonic acid, 2,6-difluorobenzenesulfonic acid, 3,5-difluorobenzenesulfonic acid, 2,3,4-trifluorobenzenesulfonic acid, 3,4,5-trifluorobenzenesulfonic acid, 2,4,6-trifluorobenzenesulfonic acid, 2,3,4,5,6-pentafluorobenzenesulfonic acid, 4-trifluoromethylbenzenesulfonic acid, 5-trifluoromethylbenzenesulfonic acid, 6-trifluoromethylbenzenesulfonic acid, and 4-trifluoromethylnaphthyl-2-sulfonic acid.

With the advance toward a finer feature size, line edge roughness and a size difference between an isolated pattern and a densely packed pattern, known as I/G bias are regarded problematic. It is well known that even when feature sizes are then same on the mask, a size difference appears between an isolated pattern and a densely packed pattern after development. This problem becomes serious with sizes in excess of the wavelength. This is because a difference in light interference upon image formation between an isolated pattern and a densely packed pattern brings about a difference in optical intensity. For example, FIG. 1 illustrates how the size of line on the ordinate changes when the pitch between repetitive lines of 0.18 microns on the abscissa is changed under optical conditions of wavelength 248 nm, NA 0.6 and σ 0.75. Under the normalization that a line size of 0.18 microns is reached at a 0.36 micron pitch (0.18 micron line+0.18 micron space), the size of an optical image once decrease (or narrows) and then increases (or thickens) as the pitch increases.

Next, the results of determining resist line sizes after development are reported. The resist size and the size of an optical image were determined using simulation software PROLITH2 Ver. 6.0 commercially available from KLA-Tencor Corp. (ex-Finle Co.). The resist size decreases with an increase of pitch and becomes increasingly thinner with the enhancement of acid diffusion. The problem of size dependency on line density that the size of an isolated pattern is thinner than that of a densely packed pattern becomes serious. It is understood from the result of simulation that an effective approach for reducing the line density dependency is to reduce the distance of acid diffusion.

However, if acid diffusion is extremely restrained, the side walls of resist patterns after development are serrated or roughened by standing waves, and line edge roughness is enhanced. The resist cross-sectional configuration of a 0.18 µm line-and-space pattern on a silicon substrate achieved when the distance of acid diffusion is changed is computed using simulation software PROLITH2 Ver. 6.0 by KLA-Tencor Corp., with the results being shown in FIG. 2. It is evident that the serration of side walls by standing waves becomes sharper as the distance of acid diffusion is reduced. For the line edge roughness as observed under overhead SEM, the same tendency is ascertained, that is, line edge roughness increases as acid diffusion decreases. A common approach for reducing the roughness of lines is by increasing the distance of acid diffusion, but this approach fails to improve the line density dependency over a certain limit. For improving line edge roughness, it may be effective to increase the optical contrast. For example, at the same exposure wavelength, the line edge roughness decreases as the line width increases. Even at the same exposure wavelength and line width, the line edge roughness decreases with an increasing NA of a stepper and in the case of repetitive patterns, is smaller with modified illumination (e.g., annular illumination, quadrupole illumination) than with normal illumination and with phase shift masks than with conventional Cr masks. The contrast at pattern line edges is correlated to the line edge roughness so that the line edge roughness is smaller as the line edge contrast is sharper. With respect to exposure wavelength, the line edge roughness is smaller with shorter wavelengths. However, when line edge roughness is compared between KrF exposure and ArF exposure, the ArF exposure is deemed advantageous to optical contrast owing to its shortness of wavelength, but actually, the KrF exposure is advantageous, as reported in SPIE 3999, 264 (2001). This is attributable to the performance difference between KrF and ArF resist materials, indicating that the line edge roughness originating from material factors upon ArF exposure is serious. It would be desirable to have a photoacid generator which improves line edge roughness and at the same time, does not exacerbate line density dependency.

SUMMARY OF THE INVENTION

An object of the invention is to provide a highly resolvable resist composition comprising a photoacid generator having a high sensitivity and high resolution to ArF excimer laser light and $F_2$ laser light and minimized line edge roughness as well as thermal stability and storage stability. Another object is to provide a patterning process using the resist composition.

It has been found that a photoacid generator capable of generating a perfluoroalkyl ether sulfonic acid, especially an onium salt having the general formula (1) defined below, is highly sensitive to ArF excimer laser light and $F_2$ laser light and has sufficient thermal stability and storage stability and that a resist composition having the photoacid generator compounded therein has a high resolution, is successful in improving line edge roughness and line density dependency, and is thus very useful for precise micropatterning.

In one aspect, the invention provides a resist composition comprising a base resin which is a high molecular weight structure free from an aromatic substituent group, a photoacid generator, and a solvent, the photoacid generator comprising a photoacid generator capable of generating a perfluoroalkyl ether sulfonic acid.

Preferably, the photoacid generator capable of generating a perfluoroalkyl ether sulfonic acid is an onium salt having the following general formula (1):

wherein $Rf^1$ is a straight, branched or cyclic $C_1$–$C_{20}$ alkyl group containing at least one fluorine atom, which may contain a hydroxy, carbonyl, ester, ether or aryl group; $Rf^2$ is a divalent, straight or branched $C_1$–$C_4$ hydrocarbon group in which hydrogen atoms may be substituted with fluorine atoms; $R^{01}$ is each independently a straight, branched or cyclic $C_1$–$C_{20}$ alkyl group which may contain a halogen atom or carbonyl, ester, thioether or ether group, a $C_6$–$C_{20}$ aryl group or a $C_7$–$C_{20}$ aralkyl group; $M^+$ is iodonium or sulfonium; and b is 2 or 3.

The preferred onium salt of formula (1) has the general formula (2):

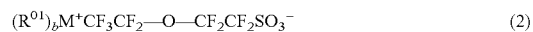

wherein $R^{01}$ and $M^+$ are as defined above, or the general formula (3):

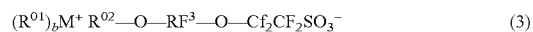

wherein $R^{01}$ and $M^+$ are as defined above; $R^{02}$ is hydrogen or a straight, branched or cyclic $C_1$–$C_{18}$ alkyl, aryl or aralkyl group which may contain fluorine atoms; $Rf^3$ is a divalent, straight or branched $C_1$–$C_4$ hydrocarbon group, preferably alkylene group, in which some or all of the hydrogen atoms may be substituted with fluorine atoms.

In a preferred embodiment, the base resin comprises at least one polymer selected from the group consisting of polyacrylic acid or a derivative thereof, a ternary, quaternary or multimeric copolymer of a cycloolefin derivative-maleic anhydride alternating copolymer and polyacrylic acid or a derivative thereof, a ternary, quaternary or multimeric copolymer of a cycloolefin derivative-maleimide alternating copolymer and polyacrylic acid or a derivative thereof, polynorbornene, and a metathesis ring-opening polymer. The base resin may also be a silicon-containing high molecular weight structure or a fluorine-containing high molecular weight structure.

Also provided is a chemically amplified positive resist composition comprising a base resin as set forth above, a photoacid generator capable of generating an acid, and a solvent, the base resin being insoluble or substantially insoluble in a developer, but becoming soluble in a developer under the action of the acid. The photoacid generator has the general formula (1):

wherein $Rf^1$, $Rf^2$, $R^{01}$, $M^+$ and b are as defined above. The chemically amplified positive resist composition may further include a basic compound and/or a dissolution inhibitor.

In another aspect, the invention provides a process for forming a resist pattern comprising the steps of applying the resist composition onto a substrate to form a coating; heat treating the coating and then exposing it to high-energy radiation having a wavelength of up to 200 nm through a photomask; and optionally heat treating the exposed coating and developing it with a developer.

DESCRIPTION OF THE PREFERRED EMBODIMENTS

Photoacid generator

Figure 1:
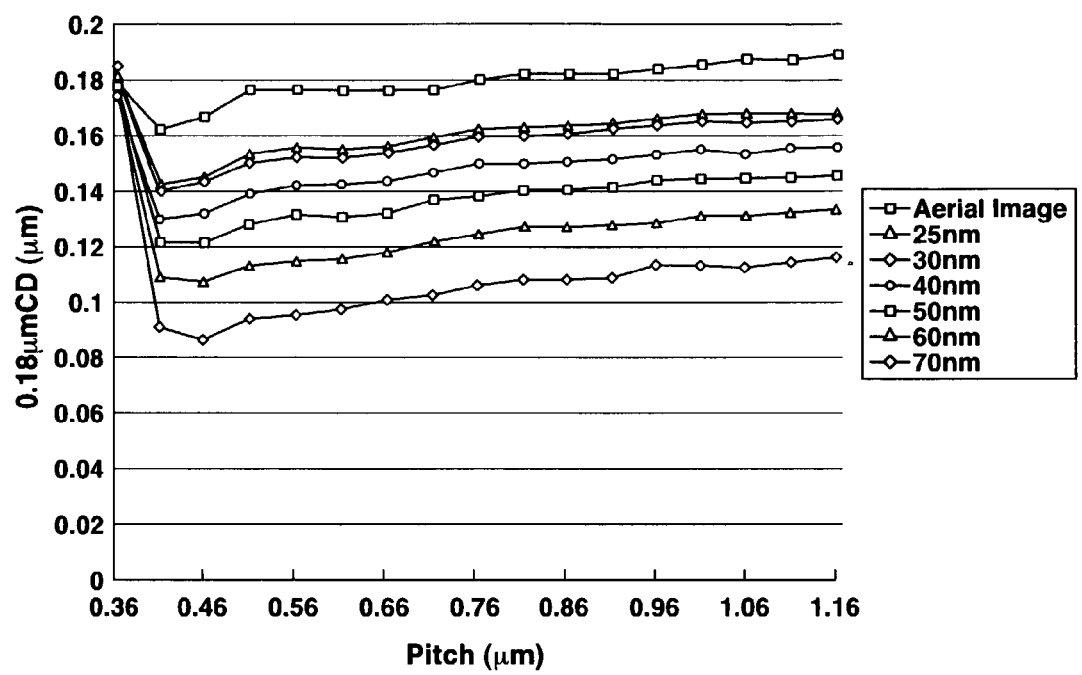
FIG. 1 is a diagram of the results of simulation computation illustrating how the line size changes when the line pitch and the distance of acid diffusion (between 25 nm and 70 nm) are changed.
Figure 2:
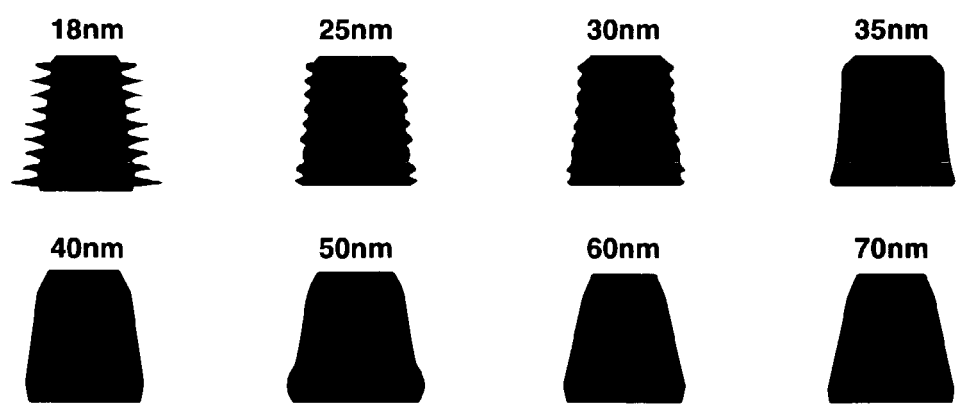
FIG. 2 illustrates the results of simulation computation of resist cross-sectional configuration when the distance of acid diffusion is changed between 18 nm and 70 nm.

The resist composition of the invention includes a base resin, a photoacid generator, and a solvent. The photoacid generator used herein is a photoacid generator capable of generating a perfluoroalkyl ether sulfonic acid upon exposure to high energy radiation having a wavelength of up to 200 nm.

The preferred photoacid generator is an onium salt having the following general formula (1).

$$(R^{01})_b M^+ \, Rf^1\text{—}O\text{—}Rf^2 SO_3^- \qquad (1)$$

Herein $Rf^1$ is a straight, branched or cyclic alkyl group of 1 to 20 carbon atoms, especially 2 to 10 carbon atoms containing at least one, preferably 2 to 20 fluorine atoms, which may contain a hydroxy (—OH), carbonyl (=C=O), ester (—COO—), ether (—O—) or aryl group of 6 to 12 carbon atoms such as phenyl, xylyl or tolyl. $Rf^2$ is a divalent, straight or branched hydrocarbon group of 1 to 4 carbon atoms, preferably alkylene group, in which some or all of the hydrogen atoms may be substituted with fluorine atoms.

$R^{01}$ which may be the same or different is a straight, branched or cyclic alkyl group of 1 to 20 carbon atoms, especially 1 to 10 carbon atoms, which may contain a halogen atom or carbonyl (=C=), ester (—COO—), thioether (—S—) or ether (—O—) group. $R^{01}$ may also be an aryl group of 6 to 12 carbon atoms, especially 6 to 10 carbon atoms, such as phenyl, xylyl, tolyl or naphthyl, or an aralkyl group of 7 to 20 carbon atoms, especially 7 to 12 carbon atoms, such as benzyl, phenylethyl or phenylpropyl. $M^+$ is iodonium or sulfonium; and b is equal to 2 when $M^+$ is iodonium, or 3 when $M^+$ is sulfonium.

In formula (1), $Rf^1$ is preferably selected from among straight or branched alkyl groups of 1 to 20 carbon atoms, especially 2 to 10 carbon atoms, in which some or all of the hydrogen atoms are substituted with fluorine atoms, the foregoing groups in which some of the hydrogen or fluorine atoms are substituted with hydroxy (OH) groups, and $R^{02}$—O—$Rf^2$— groups wherein $R^{02}$ is hydrogen or a straight, branched or cyclic alkyl group of 1 to 18 carbon atoms, especially 1 to 10 carbon atoms, an aryl group of 6 to 18 carbon atoms, especially 6 to 10 carbon atoms, or an aralkyl group of 7 to 18 carbon atoms, especially 7 to 12 carbon atoms, in which groups some or all of the hydrogen atoms may be substituted with fluorine atoms; and $Rf^3$ is a divalent, straight or branched hydrocarbon group of 1 to 4 carbon atoms, typically alkylene, in which some or all of the hydrogen atoms may be substituted with fluorine atoms, preferably $CF_2CF_2$. $Rf^2$ is most preferably $CF_2CF_2$.

Specifically, the sulfonate anion in formula (1) is a fluoroalkylsulfonic acid having at least one ether bond within the molecule, examples of which are given below.

$$CF_3CF_2\text{—}O\text{—}CF_2CF_2\text{—}SO_3^-$$
$$CH_3\text{—}O\text{—}CF_2CF_2\text{—}O\text{—}CF_2CF_2\text{—}SO_3^-$$
$$CH_3CH_2\text{—}O\text{—}CF_2CF_2\text{—}O\text{—}CF_2CF_2\text{—}SO_3^-$$
$$CH_3CH_2CH_2\text{—}O\text{—}CF_2CF_2\text{—}O\text{—}CF_2CF_2\text{—}SO_3^-$$

-continued

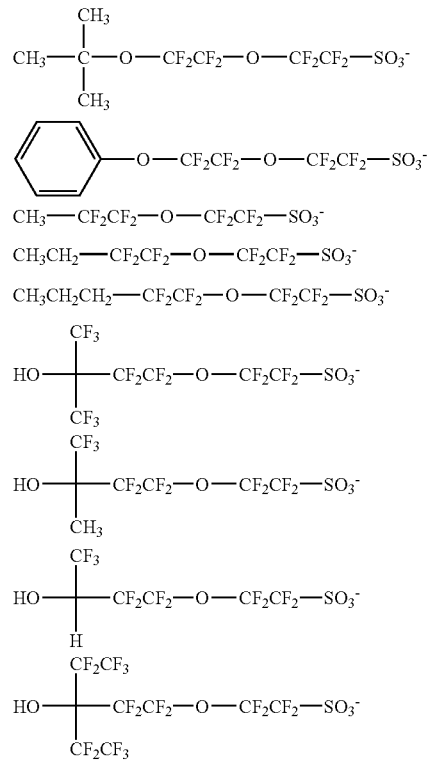

$$CH_3\text{—}CF_2CF_2\text{—}O\text{—}CF_2CF_2\text{—}SO_3^-$$
$$CH_3CH_2\text{—}CF_2CF_2\text{—}O\text{—}CF_2CF_2\text{—}SO_3^-$$
$$CH_3CH_2CH_2\text{—}CF_2CF_2\text{—}O\text{—}CF_2CF_2\text{—}SO_3^-$$

Of the onium salts of formula (1), those having the general formula (2) or (3) are preferred.

$$(R^{01})_b M^+ \, CF_3CF_2\text{—}O\text{—}CF_2CF_2 SO_3^- \qquad (2)$$

$$(R^{01})_b M^+ \, R^{02}\text{—}O\text{—}Rf^3\text{—}O\text{—}CF_2CF_2 SO_3^- \qquad (3)$$

Herein $R^{01}$, $M^+$, b, $R^{02}$ and $Rf^3$ are as defined above.

In the onium salt according to the invention, the structure of acid generated therefrom, that is, anion side is critical while the cation side is not so critical. Since M in formula (1) is a sulfur or iodine atom, the general formula (1) may be represented by the general formulae (4) and (5).

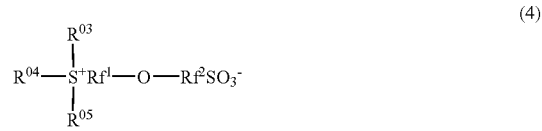

Herein, each of $R^{03}$, $R^{04}$ and $R^{05}$ which may be the same or different is a straight, branched or cyclic $C_1$–$C_{20}$ alkyl group which may contain a halogen atom, carbonyl, ester, thioether or ether group, a $C_6$–$C_{20}$ aryl group or a $C_7$–$C_{20}$ aralkyl group. A pair of $R^{03}$ and $R^{04}$, a pair of $R^{04}$ and $R^{05}$ or a pair of $R^{03}$ and $R^{05}$, taken together, may form a ring. Each of $R^{06}$ and $R^{07}$ which may be the same or different is a $C_6$–$C_{20}$ aryl group or $R^{06}$ and $R^{07}$, taken together, may form a ring. Suitable aryl groups include phenyl, xylyl, tolyl and naphthyl. Suitable aralkyl groups include benzyl, phenylethyl and phenylpropyl.
Suitable compounds of formulae (4) and (5) include those of the following structure.
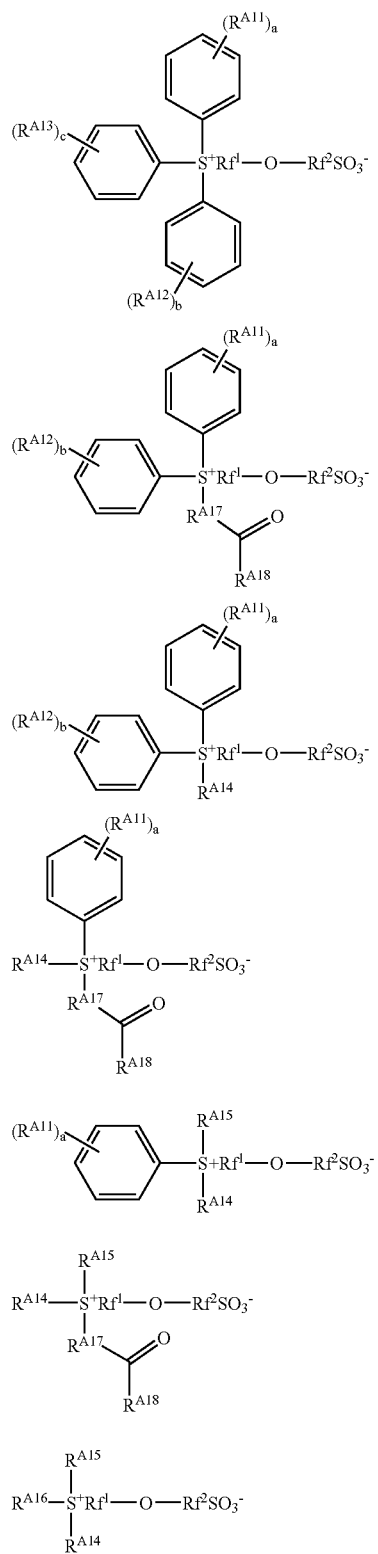
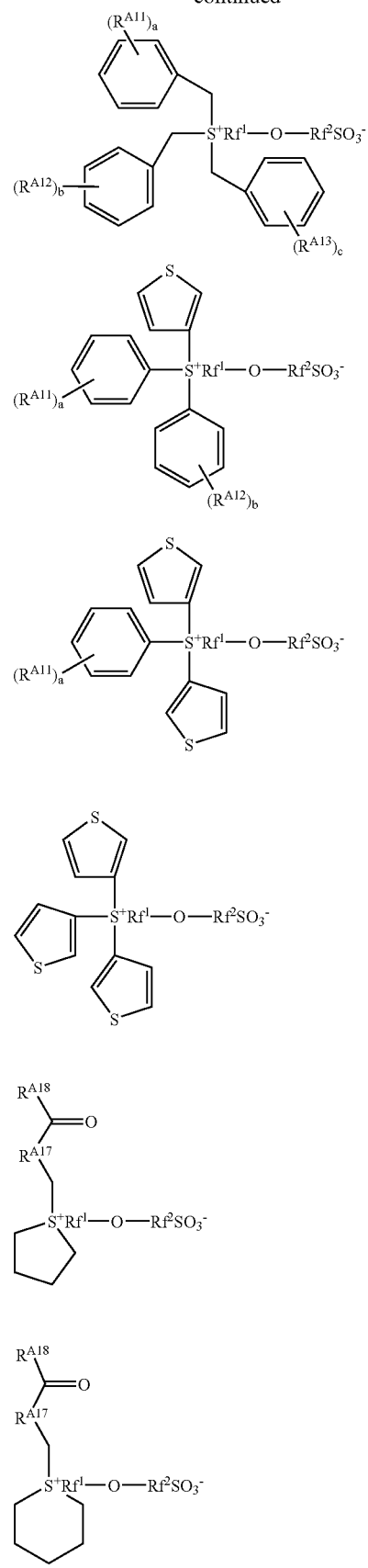

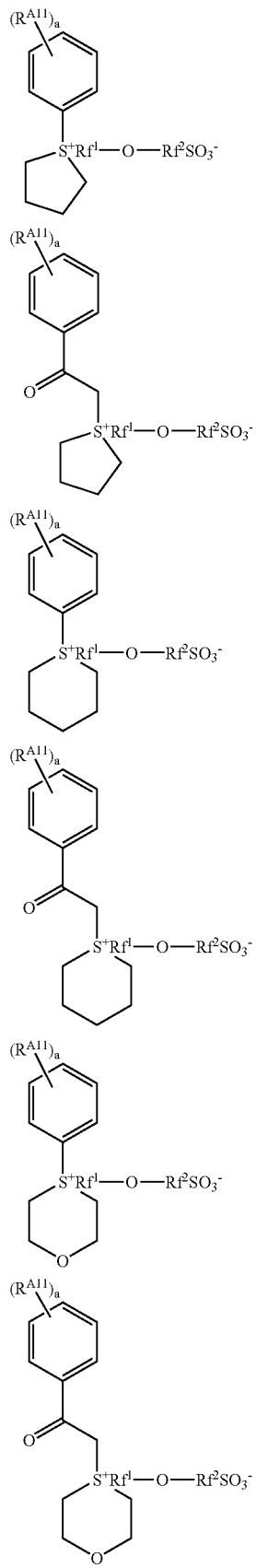
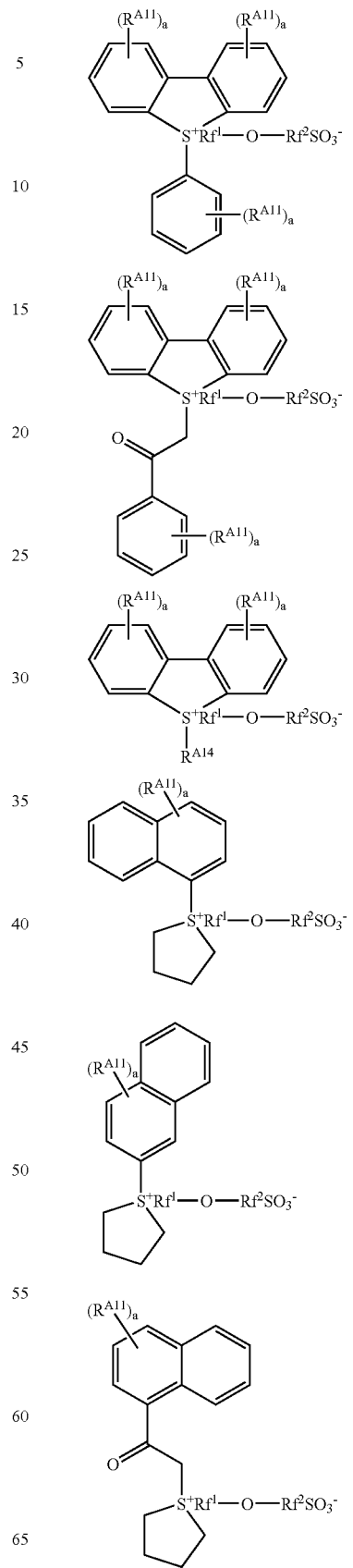

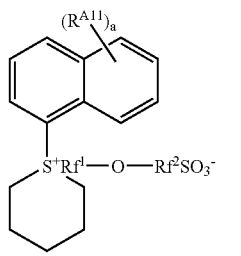
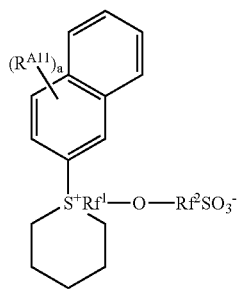
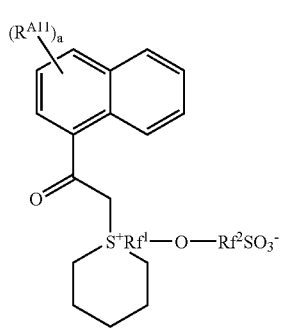
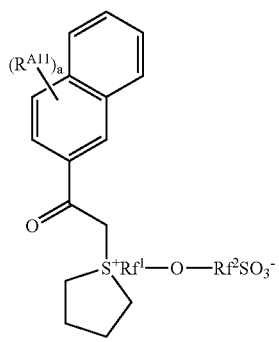
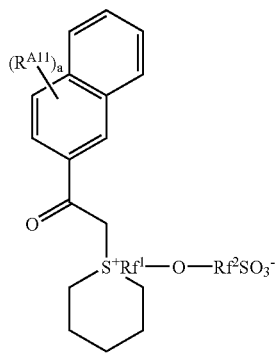
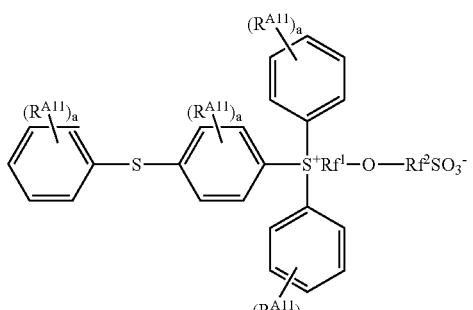
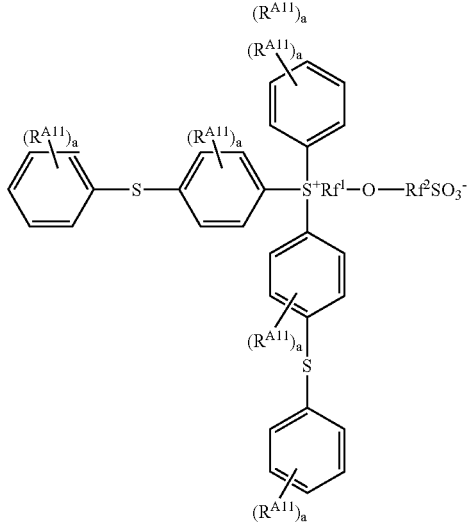

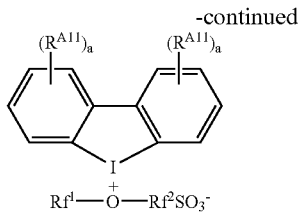

Herein, $R^{411}$, $R^{412}$, and $R^{413}$ are independently selected from among hydrogen, halogen atoms, straight, branched or cyclic $C_1$–$C_{20}$ alkyl groups, alkoxy groups, aryl groups, straight, branched or cyclic $C_1$–$C_{20}$ ester groups, carbonyl groups, and lactone ring-bearing alkyl groups. $R^{414}$, $R^{415}$, and $R^{416}$ are independently selected from among straight, branched or cyclic $C_1$–$C_{10}$ alkyl groups, which may contain a carbonyl group, ester group or lactone ring. $R^{417}$ is methylene, and $R^{418}$ is a straight, branched or cyclic $C_1$–$C_{10}$ alkyl group, or $R^{417}$ and $R^{418}$, taken together, may form a ring. The subscripts a, b and c each are an integer of 0 to 5.

An appropriate amount of the onium salt of formula (1) blended is 0.1 to 15 parts by weight, especially 0.5 to 8 parts by weight per 100 parts by weight of the base resin to be described just below. Outside the range, a smaller amount of the onium salt may lead to a lower sensitivity whereas a larger amount of the onium salt may lead to low transparency and lower the resolution of a resist composition.

Base resin

The base resin used in the inventive resist composition is a high molecular weight structure free from an aromatic substituent group. Typically the base resin comprises at least one polymer (or high molecular weight compound) selected from among polyacrylic acid and derivatives thereof, ternary, quaternary or multimeric copolymers of a cycloolefin derivative-maleic anhydride alternating copolymer and polyacrylic acid or a derivative thereof, ternary, quaternary or multimeric copolymers of a cycloolefin derivative-maleimide alternating copolymer and polyacrylic acid or a derivative thereof, polynorbornene, and metathesis ring-opening polymers; more preferably a polymer comprising recurring units of the following general formula (6) and having a weight average molecular weight (Mw) of 1,000 to 500,000, especially 5,000 to 100,000. Blends of two or more of the foregoing polymers are also useful.

Where it is desired to formulate the resist composition to the chemical amplification positive working type, the base resin used is a resin which is insoluble or substantially insoluble in a developer, typically an alkaline developer, but becomes soluble in a developer under the action of an acid. Use is then made of resins having acid labile groups, that is groups which are cleavable with an acid.

(6)

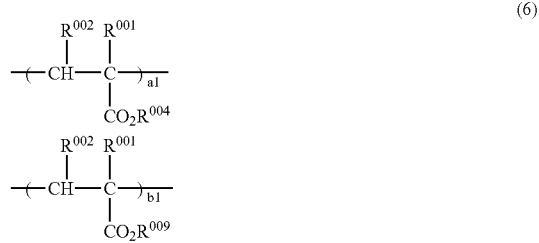

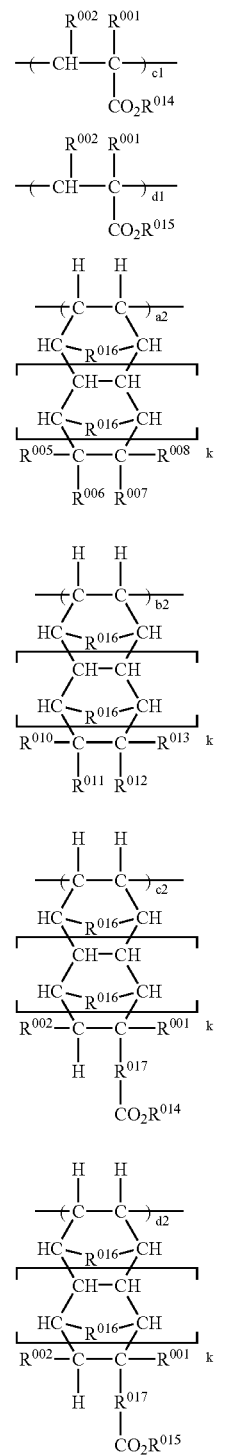

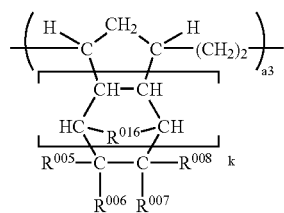

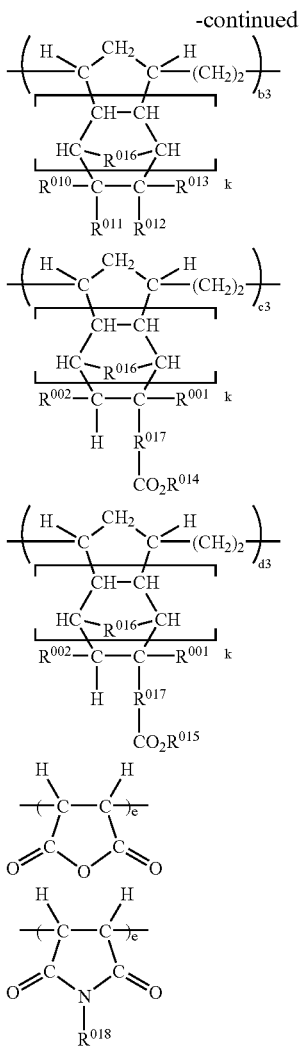

Herein, $R^{001}$ is hydrogen, fluorine, methyl, trifluoromethyl or $CH_2CO_2R^{003}$. $R^{002}$ is hydrogen, methyl or $CO_2R^{003}$. $R^{003}$ is a straight, branched or cyclic $C_1$–$C_{15}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1$–$C_{15}$ hydrocarbon group (preferably straight, branched or cyclic alkyl group) having a carboxyl or hydroxyl group, for example, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

At least one of $R^{005}$ to $R^{008}$ represents a monovalent $C_1$–$C_{15}$ hydrocarbon group (preferably straight, branched or cyclic alkyl group) having a carboxyl or hydroxyl group or a hydroxy group having a fluorine atom or fluorinated alkyl group at β-position while may remaining R substituents independently represent hydrogen, fluorine or a straight, branched or cyclic $C_1$–$C_{15}$ alkyl or fluorinated alkyl group. Examples of the carboxyl or hydroxyl-bearing monovalent $C_1$–$C_{15}$ hydrocarbon group include carboxy, carboxymethyl, carboxyethyl, carboxybutyl, hydroxymethyl, hydroxyethyl, hydroxybutyl, 2-carboxyethoxycarbonyl, 4-carboxybutyoxycarbonyl, 2-hydroxyethyoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the straight, branched or cyclic $C_1$–$C_{15}$ alkyl group are the same as exemplified for $R^{003}$. Alternatively, $R^{005}$ to $R^{008}$, taken together, may form a ring, and in that event, at least one of $R^{005}$ to $R^{008}$ is a divalent $C_1$–$C_{15}$ hydrocarbon group (preferably straight or branched alkylene group) having a carboxyl or hydroxyl group, while any remaining R substituents are independently single bonds or straight, branched or cyclic $C_1$–$C_{15}$ alkylene groups. Examples of the carboxyl or hydroxyl-bearing divalent $C_1$–$C_{15}$ hydrocarbon group include the groups exemplified as the carboxyl or hydroxyl-bearing monovalent hydrocarbon group, with one hydrogen atom eliminated therefrom. Examples of the straight, branched or cyclic $C_1$–$C_{15}$ alkylene groups include the groups exemplified for $R^{003}$, with one hydrogen atom eliminated therefrom.

$R^{009}$ is a monovalent $C_3$–$C_{15}$ hydrocarbon group containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$–$C_{15}$ hydrocarbon group containing a —$CO_2$— partial structure or sulfone or sulfonamide, while any remaining R substituents are independently hydrogen or straight, branched or cyclic $C_1$–$C_{15}$ alkyl groups. Examples of the monovalent $C_2$–$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$–$C_{15}$ alkyl groups are the same as exemplified for $R^{003}$.

$R^{010}$ to $R^{013}$, taken together, may form a ring, and in that event, at least one of $R^{010}$ to $R^{013}$ is a divalent $C_1$–$C_{15}$ hydrocarbon group containing a —$CO_2$— partial structure, while any remaining R substituents are independently single bonds or straight, branched or cyclic $C_1$–$C_{15}$ alkylene groups. Examples of the divalent $C_1$–$C_{15}$ hydrocarbon group containing a —$CO_2$— partial structure include 1-oxo-2-oxapropane-1,3-dilyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$–$C_{15}$ alkylene groups include the groups exemplified for $R^{003}$, with one hydrogen atom eliminated therefrom.

$R^{014}$ is a polycyclic hydrocarbon group having 7 to 15 carbon atoms or an alkyl group containing a polycyclic hydrocarbon group, for example, norbornyl, bicyclo[3.3.1]-nonyl, tricyclo[5.2.1.0$^{2.6}$]decyl, adamantyl, ethyladamantyl, butyladamantyl, norbornylmethyl, and adamantylmethyl. $R^{015}$ is an acid labile group. $R^{016}$ is a methylene group or oxygen atom. $R^{017}$ is absent or a straight, branched or cyclic $C_1$–$C_{10}$ alkylene group which may have a hetero atom-containing substituent such as hydroxy, alkoxy or acetyl. $R^{018}$ is hydrogen or a $C_1$–$C_{10}$ alkyl group. Letter k is equal to 0 or 1; a1, a2, a3, b1, b2, b3, c1, c2, c3, d1, d2, d3, and e are numbers from 0 to less than 1.

Illustrative examples of the acid labile group represented by $R^{015}$ include groups of the following formulae (L1) to (L5), tertiary alkyl groups of 4 to 20 carbon atoms, preferably 4 to 15 carbon atoms, trialkylsilyl groups whose alkyls each have 1 to 6 carbon atoms, and oxoalkyl groups of 4 to 20 carbon atoms.

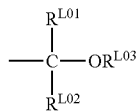
(L1)

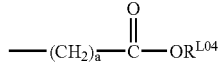
(L2)

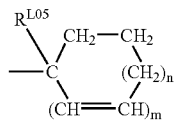
(L3)

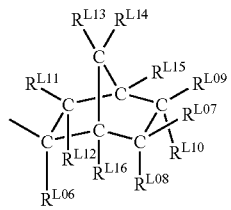
(L4)

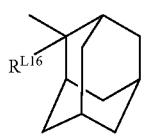
(L5)

Herein, $R^{L01}$ and $R^{L02}$ each are hydrogen or a straight, branched or cyclic alkyl group of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may have a hetero atom such as an oxygen atom, for example, straight, branched or cyclic alkyl groups, in which some hydrogen atoms may be replaced by hydroxy, alkoxy, oxo, amino, or alkylamino groups. More illustrative of the $R^{L03}$ group are the substituted alkyl groups shown below.

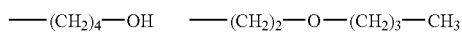

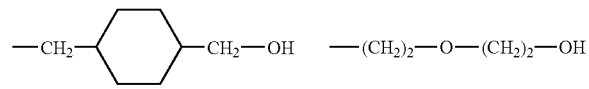

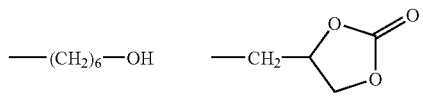

A pair of $R^{L01}$ and $R^{L02}$, a pair of $R^{L01}$ and $R^{L03}$, or a pair of $R^{L02}$ and $R^{L03}$, taken together, may form a ring. $R^{101}$, $R^{L02}$ and $R^{L03}$ each represent straight or branched alkylene groups of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, trialkylsilyl group whose alkyls each have 1 to 6 carbon atoms, oxoalkyl group of 4 to 20 carbon atoms, or group of above formula (L1). Exemplary tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl and dimethyl-tert-butylsilyl. Examples of oxoalkyl groups include 3-oxocyclohexyl, 4-methyl-2-oxooxan-4-yl, and 5-methyl-5-oxooxolan-4-yl. The letter "a" is an integer of 0 to 6.

$R^{L05}$ is a straight, branched or cyclic alkyl group of 1 to 8 carbon atoms or substituted or unsubstituted aryl group of 6 to 20 carbon atoms. Exemplary straight, branched or cyclic alkyl groups include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl, and cyclohexylethyl. Exemplary substituted or unsubstituted aryl groups include phenyl, methylphenyl, naphthyl, anthryl, phenanthryl, and pyrenyl. The letter m is equal to 0 to 1, and n is equal to 0, 1, 2, or 3, satisfying 2m+n=2 to 3.

$R^{L06}$ is a straight, branched or cyclic $C_{1-8}$ alkyl group or a substituted or unsubstituted $C_{6-20}$ aryl group. Examples of these groups are as exemplified for $R^{L05}$.

$R^{L07}$ to $R^{L16}$ are independently hydrogen or monovalent $C_{1-15}$ hydrocarbon groups which may contain a hetero atom. Examples of the hydrocarbon groups include straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl; and substituted groups in which some of the hydrogen atoms on the foregoing groups are replaced by hydroxyl, alkoxy, carboxyl, alkoxycarbonyl, oxo, amino, alkylamino, cyano, mercapto, alkylthio and sulfo groups. Any pair of $R^{L07}$ to $R^{L16}$ (e.g., a pair of $R^{L07}$ and $R_{L08}$, a pair of $R^{L07}$ and $R_{L09}$, a pair of $R^{L08}$ and $R^{L10}$, a pair of $R^{L09}$ and $R^{L10}$, a pair of $R^{L11}$ and $R^{L12}$, and a pair of $R^{L13}$ and $R^{L14}$) may form a ring. When these R's in pair form a ring, they are independently divalent $C_{1-15}$ hydrocarbon groups which may contain a hetero atom, examples of which are the same as exemplified above for the monovalent hydrocarbon groups, with one hydrogen atom eliminated therefrom. Also any pair of $R^{L07}$ to $R^{L16}$ which are bonded to two adjacent carbon atoms may bond together directly to form a double bond (e.g., a pair of $R^{L07}$ and $R^{L09}$, a pair of $L^{L13}$ and $R^{L15}$).

Of the acid labile groups of formula (L1), straight and branched groups are illustrated below.

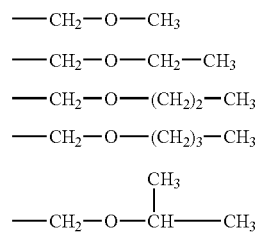

-continued

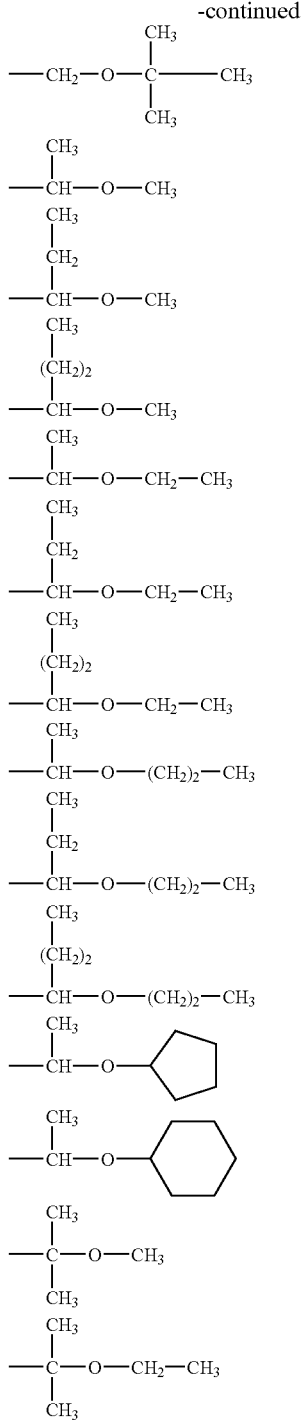

Of the acid labile groups of formula (L1), exemplary cyclic groups include tetrahydrofuran-2-yl, 2-methyltetrahydrofuran-2-yl, tetrahydropyran-2-yl and 2-methyltetrahydropyran-2-yl.

Illustrative examples of the acid labile group of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Illustrative examples of the acid labile group of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Illustrative examples of the acid labile group of formula (L4) are given below.

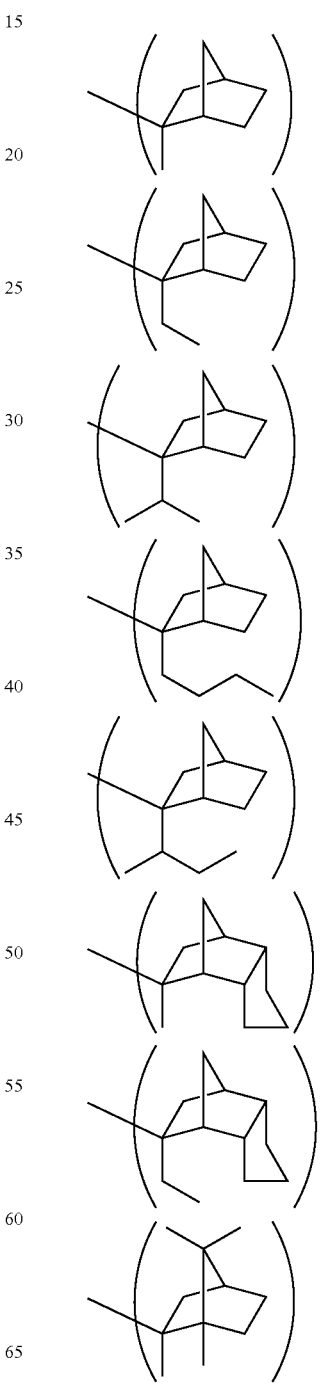

-continued

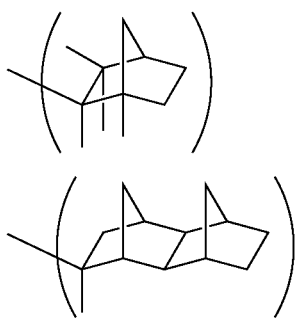

Examples of the tertiary alkyl, trialkylsilyl and oxoalkyl groups included in the acid labile group represented by $R^{015}$ are the same as exemplified above.

Illustrative examples of the acid labile group of formula (L5) are given below.

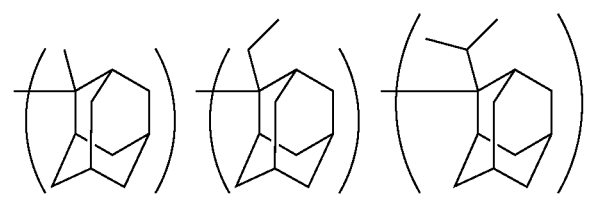

In another preferred embodiment, the acid labile groups are silicon-containing acid labile groups as shown below.

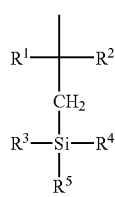 (A-4)

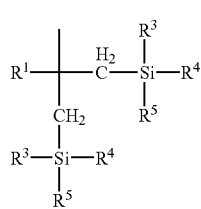 (A-5)

-continued

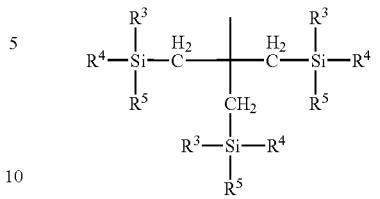 (A-6)

Herein, $R^1$ and $R^2$ each are hydrogen or a $C_1$–$C_{20}$ alkyl group. Each of $R^3$, $R^4$ and $R^5$ which may be the same or different is a $C_1$–$C_{20}$ alkyl group, haloalkyl group, $C_6$–$C_{20}$ aryl group, trialkylsilyl group, or silicon-containing group which is bonded to the silicon atom through a siloxane or silethylene bond. $R^1$ and $R^2$ may bond together to form a ring.

Illustrative examples of the groups of formulae (A-4), (A-5) and (A-6) are given below.

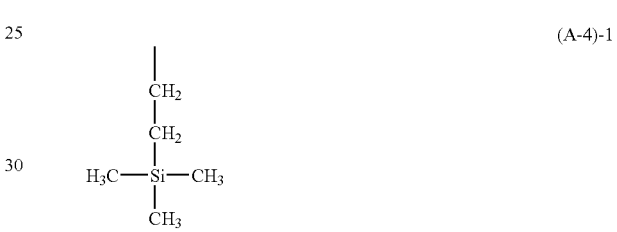 (A-4)-1

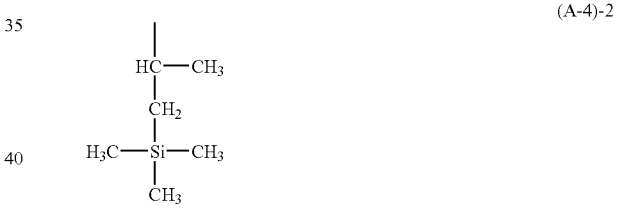 (A-4)-2

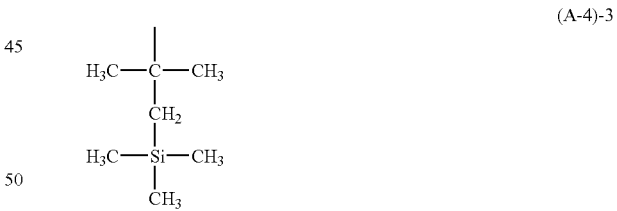 (A-4)-3

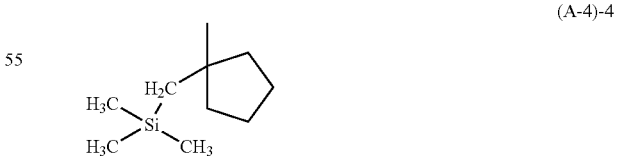 (A-4)-4

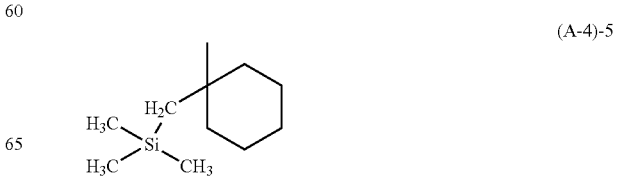 (A-4)-5

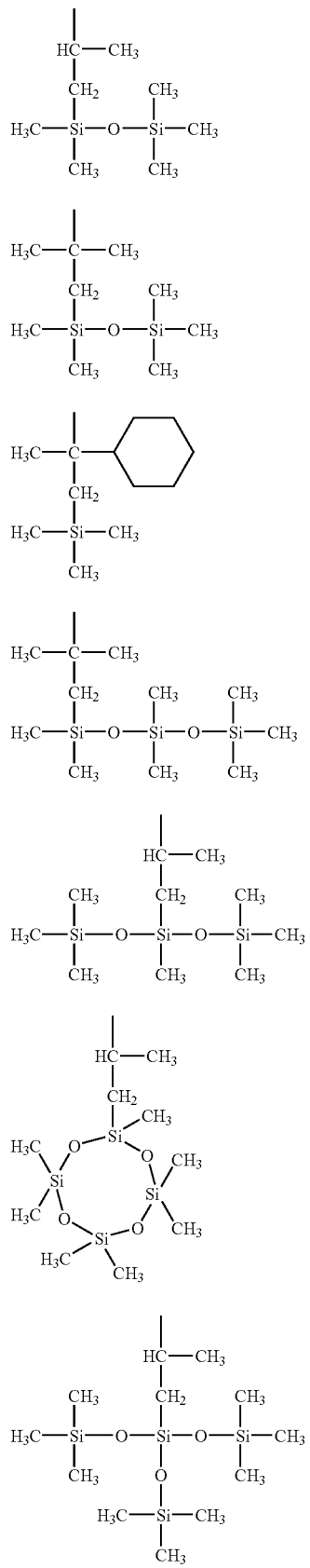
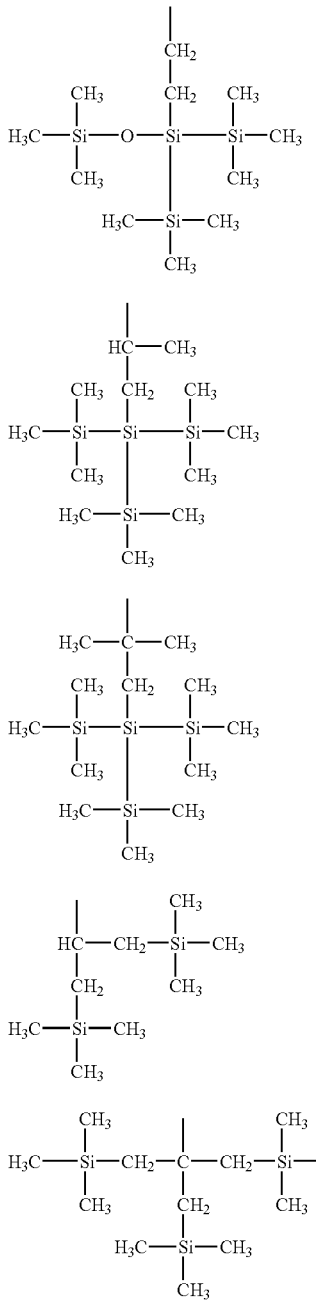
Cyclic silicon-containing acid labile groups of the following general formulae (A-7) and (A-8) are also useful.
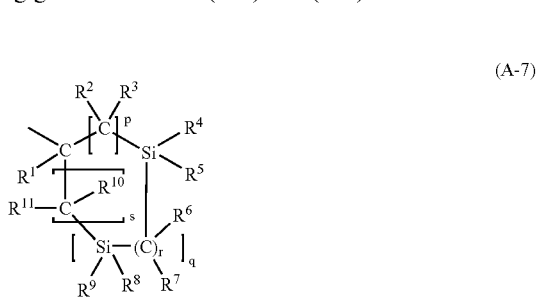

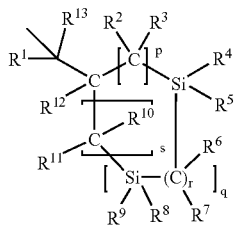
(A-8)

Herein, $R^1$ and $R^{13}$ each are a straight, branched or cyclic $C_1$–$C_{20}$ alkyl group. $R^2$, $R^3$, $R^6$, $R^7$, $R^{10}$, $R^{11}$ and $R^{12}$ each are hydrogen or a straight, branched or cyclic $C_1$–$C_{20}$ alkyl group. $R^4$, $R^5$, $R^8$ and $R^9$ each are hydrogen, a straight, branched or cyclic $C_1$–$C_{20}$ alkyl group, $C_1$–$C_{20}$ fluorinated alkyl group, or $C_6$–$C_{20}$ aryl group. The letters p, q, r and s each are an integer of 0 to 10 and $1 \leq p+q+s \leq 20$. Illustrative examples are given below.

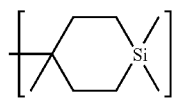
(A-7)-1

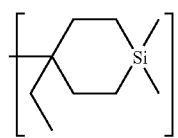
(A-7)-2

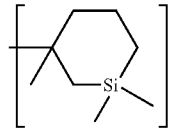
(A-7)-3

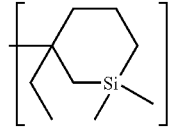
(A-7)-4

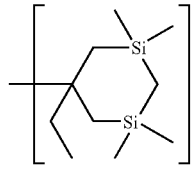
(A-7)-5

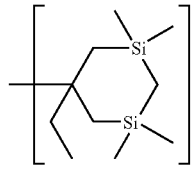
(A-7)-6

(A-8)-1

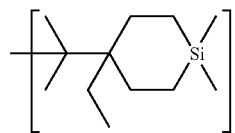
(A-8)-2

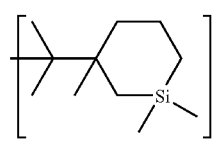
(A-8)-3

(A-8)-4

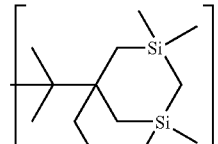
(A-8)-5

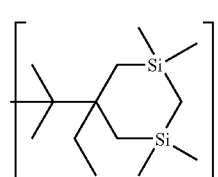
(A-8)-6

Referring back to formula (6), the recurring units with subscripts a1 and b1 contain hydrophilic adhesive groups and are exemplified below by formulae (6)-1 through (6)-40.

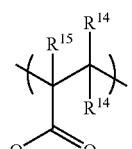
(6)-1

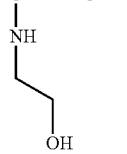

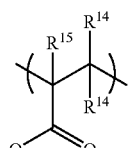
(6)-2

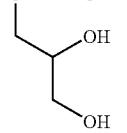

(6)-3 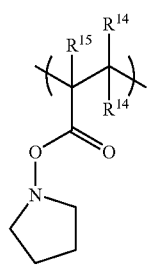
(6)-4 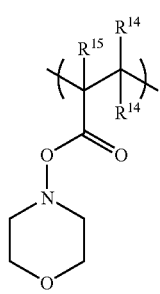
(6)-5 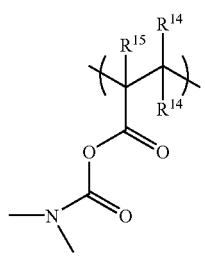
(6)-6 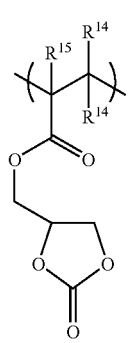
(6)-7 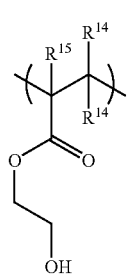
(6)-8 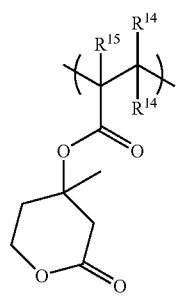
(6)-9 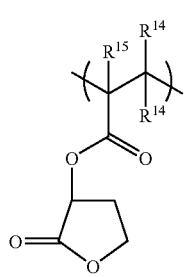
(6)-10 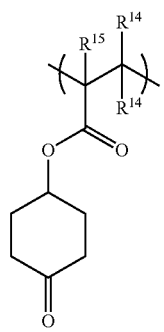
(6)-11 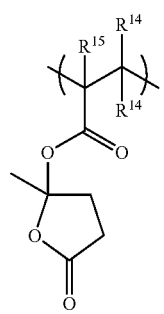
(6)-12 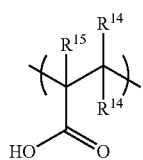

-continued
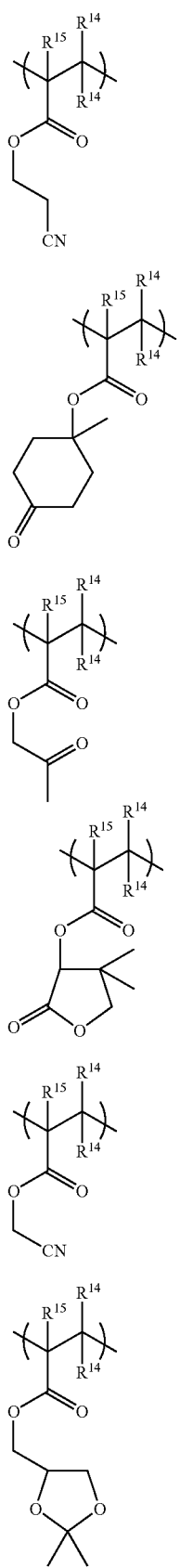
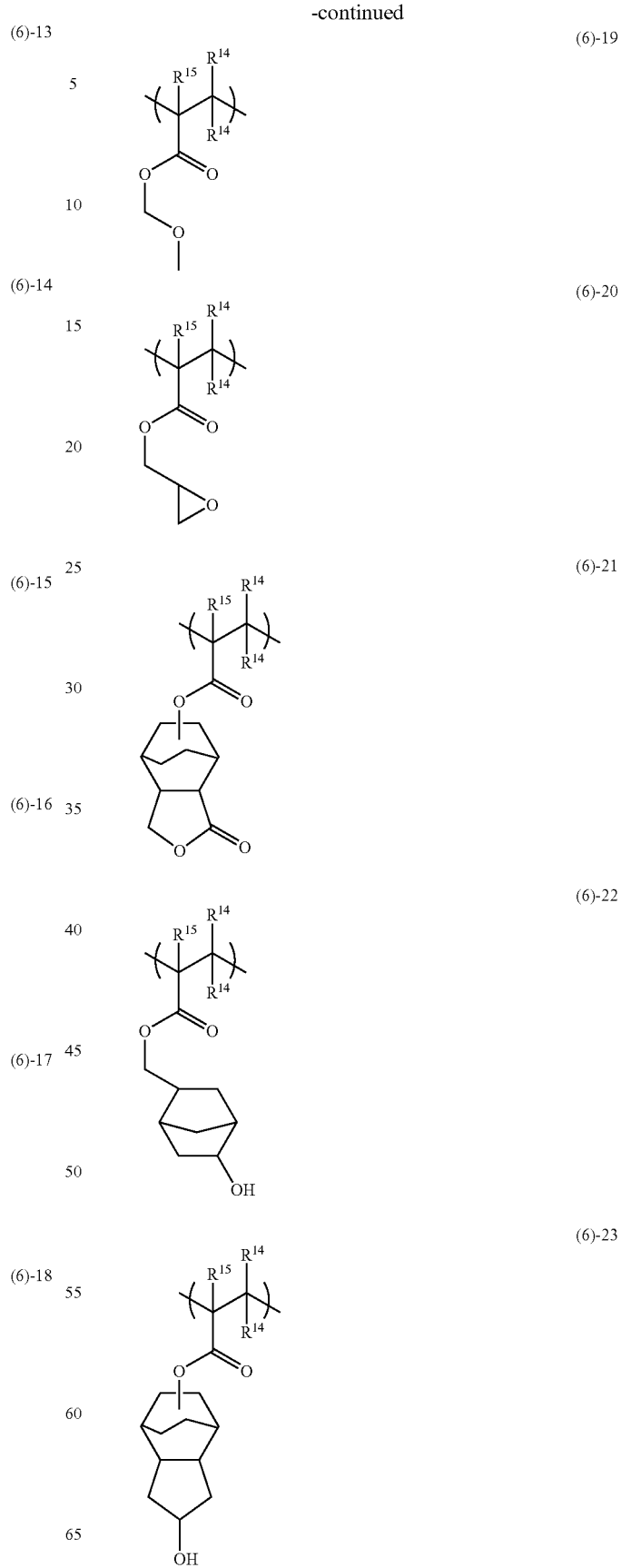

-continued
(6)-24
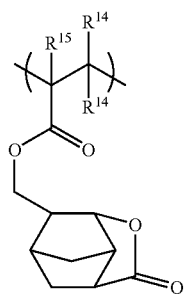
(6)-25
(6)-26
(6)-27
-continued
(6)-28
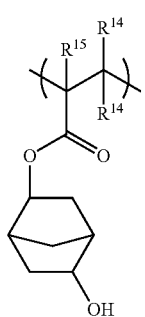
(6)-29
(6)-30
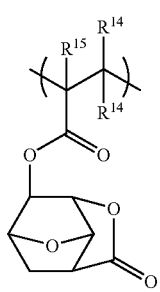
(6)-31
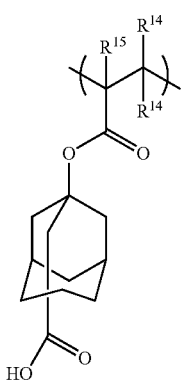

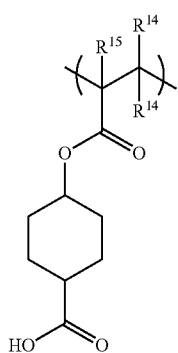
(6)-32
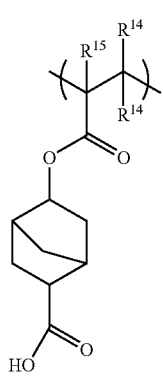
(6)-33
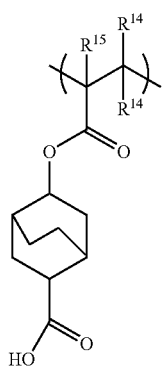
(6)-34
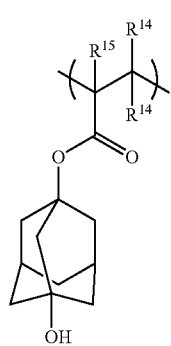
(6)-35
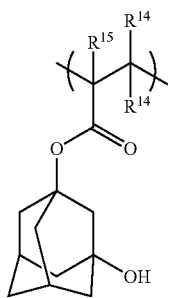
(6)-36
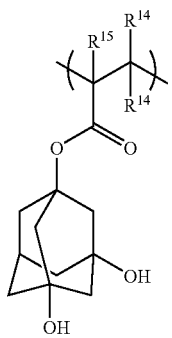
(6)-37
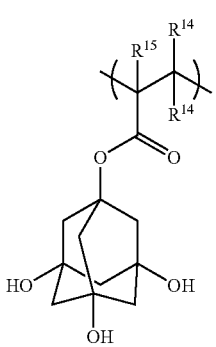
(6)-38
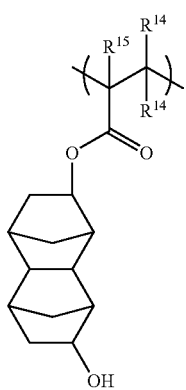
(6)-39

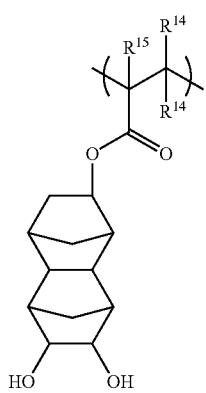
(6)-40
Herein, $R^{14}$ is hydrogen or a straight, branched or cyclic alkyl group of 1 to 20 carbon atoms, and $R^{15}$ is hydrogen, methyl, fluorine atom or trifluoromethyl.
The recurring units with subscripts a2 and b2 contain hydrophilic adhesive groups and are exemplified below by formulae (7)-1 through (7)-54. Note that n is 0 or 1 in formulae (7)-1 through (7)-54.
(7)-1
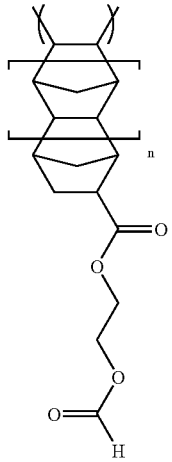
(7)-2
(7)-3
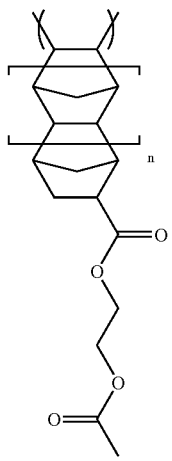
(7)-4
(7)-5
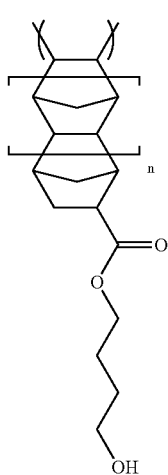

(7)-6
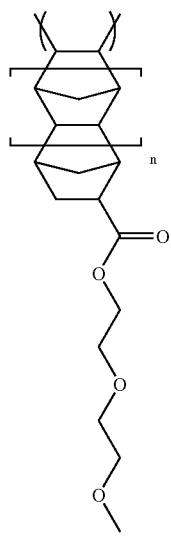
(7)-7
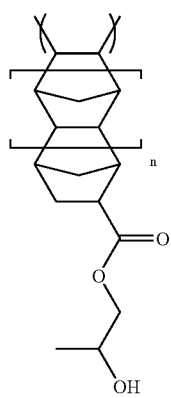
(7)-8
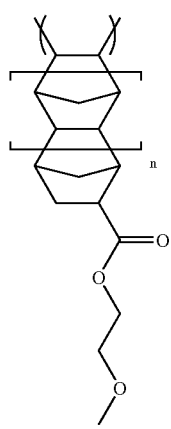
(7)-9
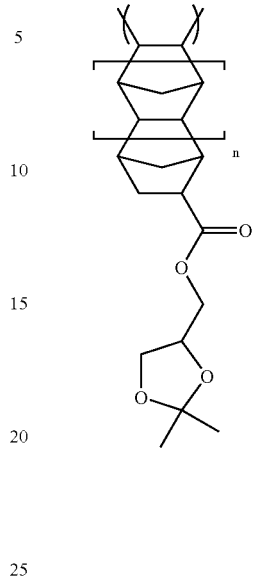
(7)-10
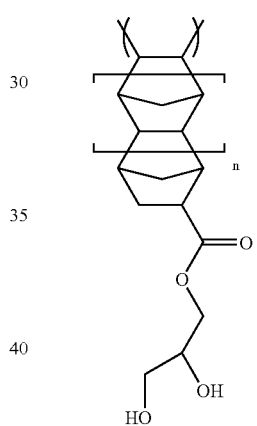
(7)-11
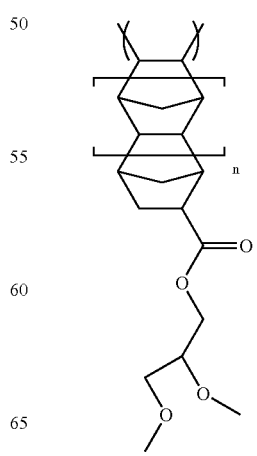

(7)-12
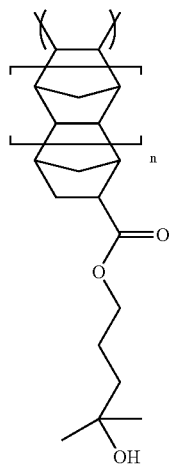
(7)-13
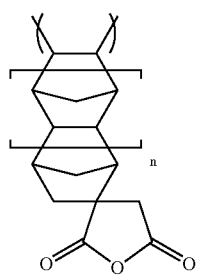
(7)-14
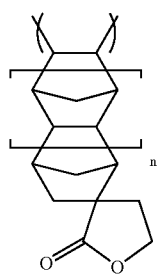
(7)-15
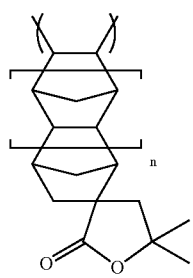
(7)-16
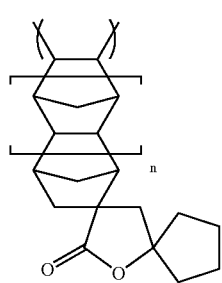
(7)-17
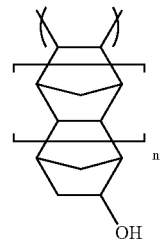
(7)-18
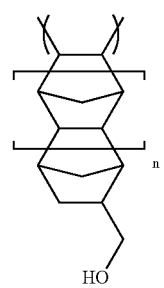
(7)-19
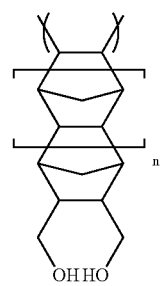
(7)-20
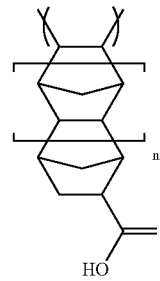
(7)-21
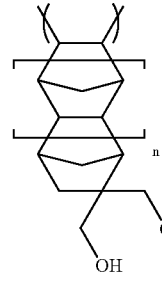

-continued
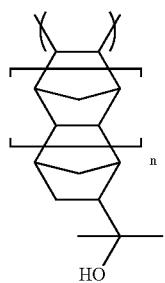
(7)-22
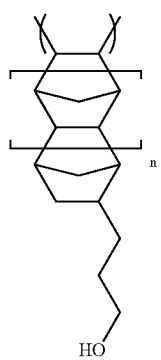
(7)-23
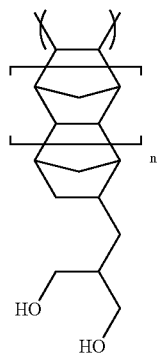
(7)-24
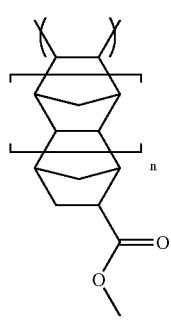
(7)-25
-continued
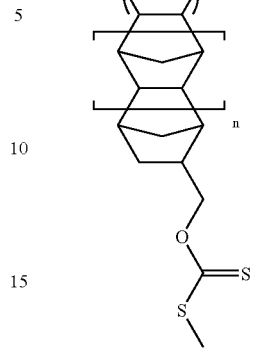
(7)-26
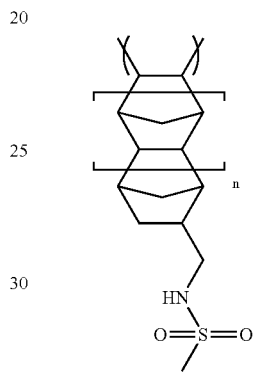
(7)-27
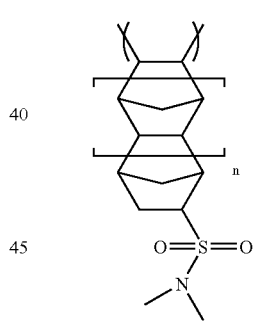
(7)-28
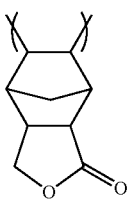
(7)-29
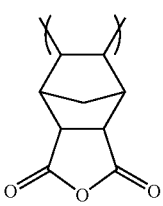
(7)-30

(7)-31
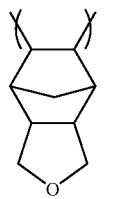
(7)-32
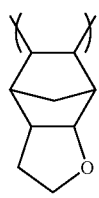
(7)-33
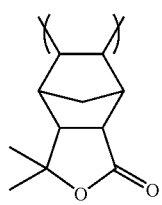
(7)-34
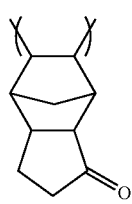
(7)-35
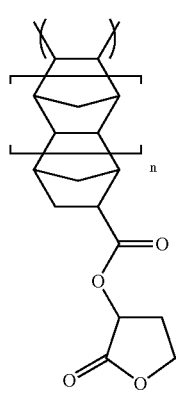
(7)-36
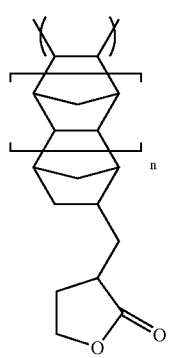
(7)-37
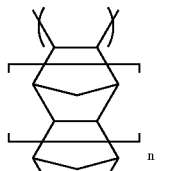
(7)-38
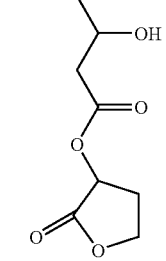
(7)-39
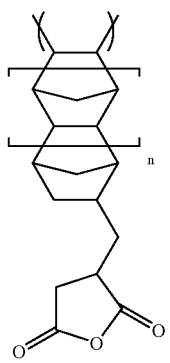
(7)-40
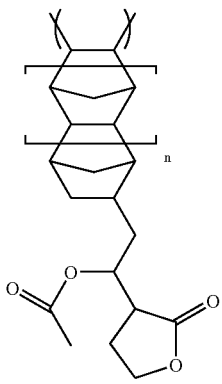
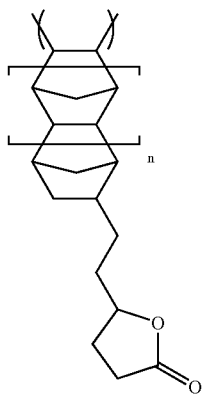

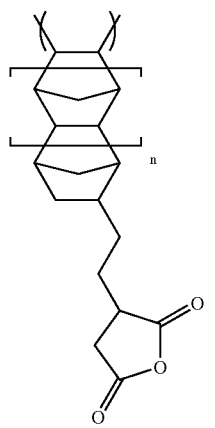 (7)-41
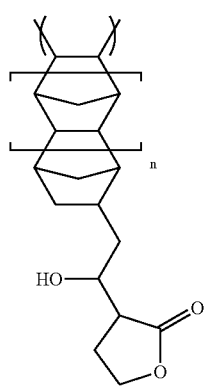 (7)-42
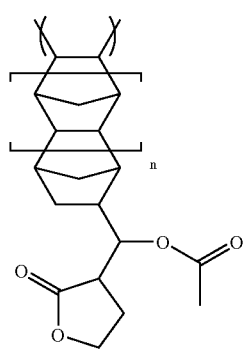 (7)-43
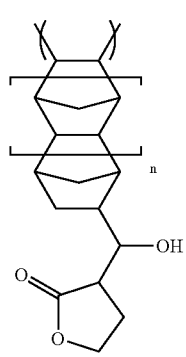 (7)-44
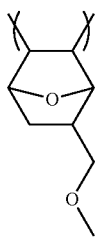 (7)-45
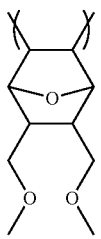 (7)-46
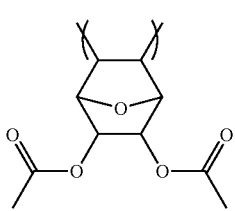 (7)-47
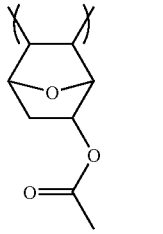 (7)-48
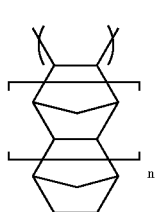 (7)-49
(7)-50

-continued (7)-51
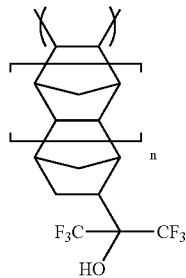

(7)-52
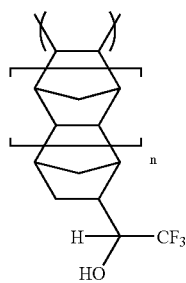

(7)-53
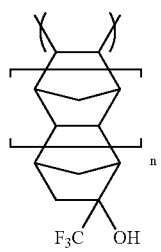

(7)-54
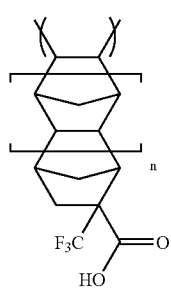

In the high molecular weight structure used as the base resin according to the present invention, there may be further copolymerized recurring units other than those with subscripts a1, a2, a3, b1, b2, b3, c1, c2, c3, d1, d2, d3, and e. For example, fluorinated maleic anhydrides and fluorinated maleimides having the following formulae (8)-1 to (8)-8 may be incorporated as well as vinyl ether derivatives, allyl ether derivatives, vinyl acetate, vinyl pyrrolidone, and vinyl lactone derivatives.

(8)-1
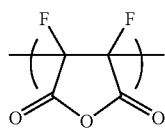

(8)-2
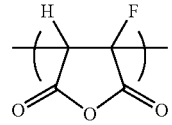

(8)-3
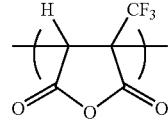

(8)-4
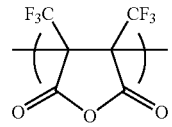

(8)-5
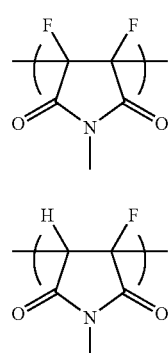

(8)-6
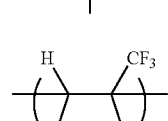

(8)-7
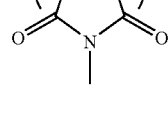

(8)-8
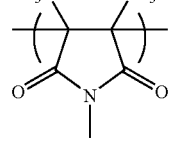

Other useful base resins are silicon-containing high molecular weight structures. Suitable silicon-containing recurring units are those of the formulae (9)-1 through (9)-5. They preferably have a Mw of about 3,000 to 100,000.

(9)-1
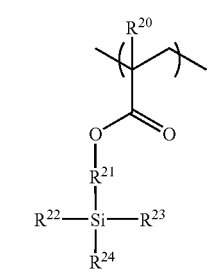

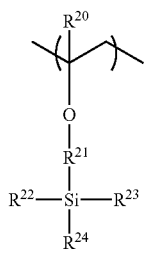 (9)-2

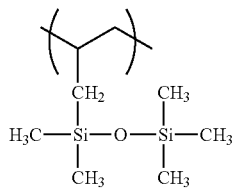 (10)-1

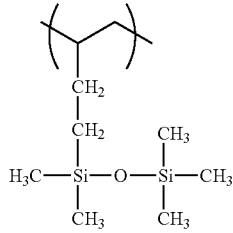 (10)-2

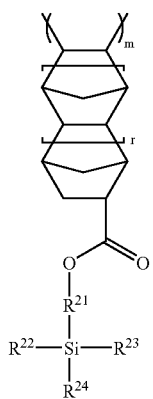 (9)-3

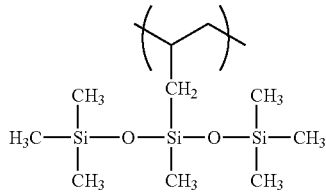 (10)-3

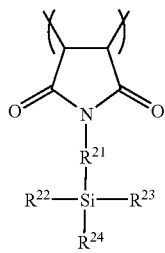 (9)-4

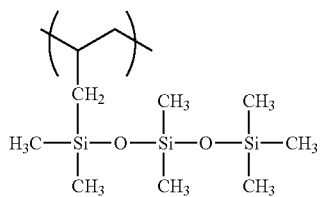 (10)-4

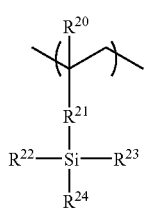 (9)-5

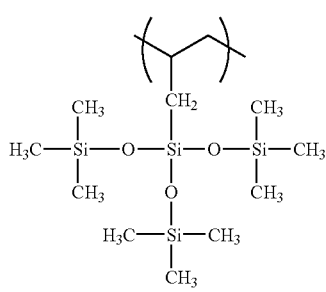 (10)-5

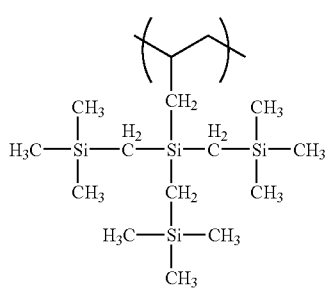 (10)-6

Herein, $R^{20}$ is hydrogen, methyl, fluorine atom or trifluoromethyl; $R^{21}$ is a single bond or a divalent $C_1$–$C_{10}$ hydrocarbon group such as alkylene; each of $R^{22}$, $R^{23}$ and $R^{24}$ which may be the same or different is hydrogen, $C_1$–$C_{10}$ alkyl, aryl, fluorinated alkyl group, silicon-containing hydrocarbon group, or a siloxane bond-containing group; or a pair of $R^{22}$ and $R^{23}$, $R^{23}$ and $R^{24}$, or $R^{22}$ and $R^{24}$, taken together, may form a ring.

More illustratively, the units of formula (9)-5 are exemplified by those of formulae (10)-1 through (10)-16. Exemplary —$R^{21}$—$SiR^{22}R^{23}R^{24}$ moieties in formulae (9)-1 through (9)-4 are the same as in formulae (10)-1 through (10)-16.

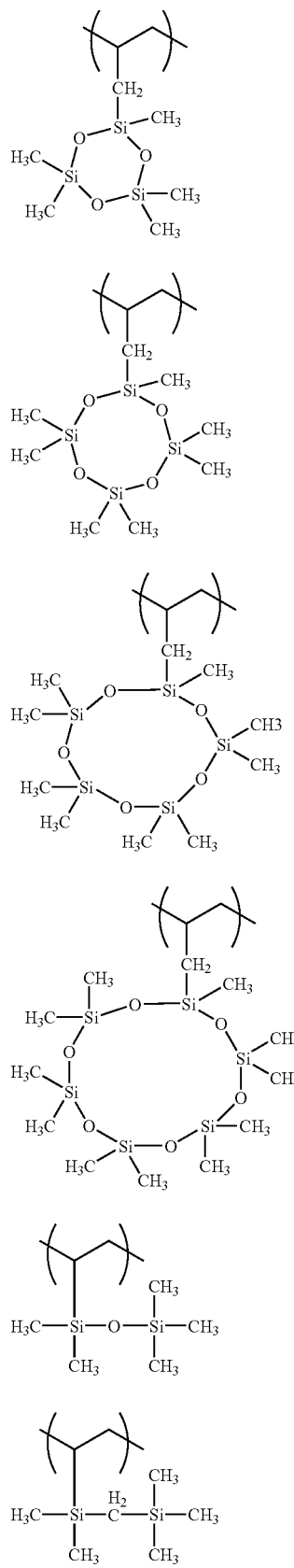
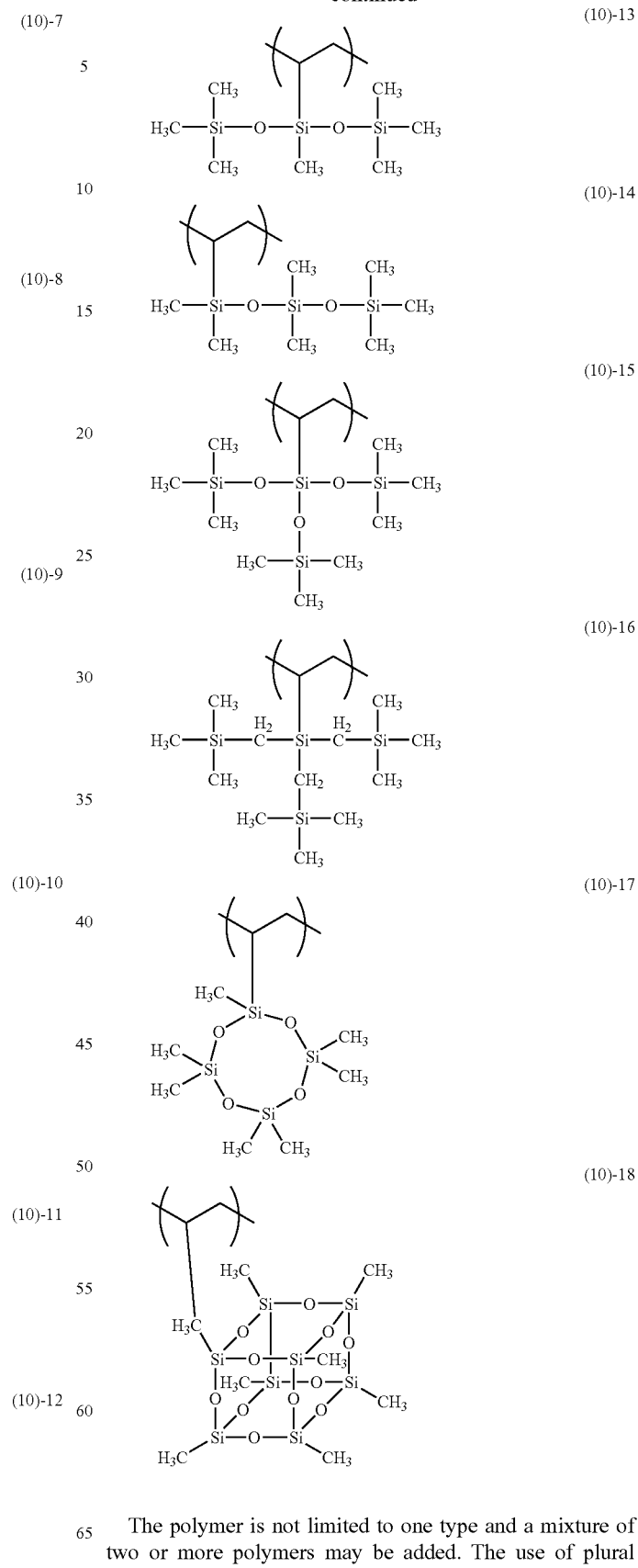
The polymer is not limited to one type and a mixture of two or more polymers may be added. The use of plural polymers allows for easy adjustment of resist properties.

Fluorine-containing high molecular weight structures are also useful as the base resin. Suitable fluorine-containing recurring units are those of the formulae (11)-1 through (11)-7. They preferably have a Mw of about 3,000 to 100,000.

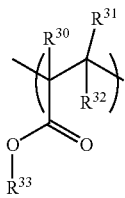
(11)-1

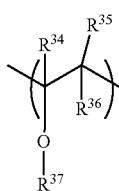
(11)-2

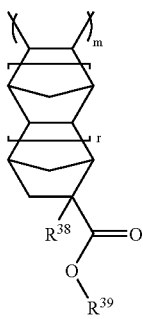
(11)-3

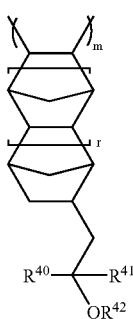
(11)-4

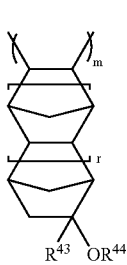
(11)-5

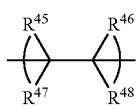
(11)-6

-continued

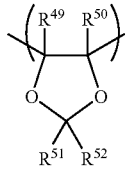
(11)-7

Herein, each of $R^{30}$, $R^{31}$ and $R^{32}$ which may be the same or different is hydrogen, fluorine atom, methyl or trifluoromethyl, with $R^{30}$ to $R^{32}$ containing at least one fluorine atom. Each of $R^{33}$, $R^{38}$, $R^{42}$ and $R^{44}$ which may be the same or different is hydrogen, an acid labile group or adhesive group. Each of $R^{34}$, $R^{35}$ and $R^{36}$ which may be the same or different is hydrogen, fluorine atom, methyl or trifluoromethyl, with $R^{34}$ to $R^{36}$ containing at least one fluorine atom. $R^{38}$ and $R^{43}$ each are hydrogen, fluorine atom, methyl or trifluoromethyl. $R^{40}$ and $R^{41}$ each are hydrogen, fluorine, a $C_1$–$C_4$ alkyl or fluorinated alkyl group, with $R^{40}$ and $R^{41}$ containing at least one fluorine atom. Each of $R^{45}$, $R^{46}$, $R^{47}$ and $R^{48}$ is hydrogen, fluorine, a $C_1$–$C_4$ alkyl or fluorinated alkyl group, with $R^{45}$, $R^{46}$, $R^{47}$ and $R^{48}$ containing at least one fluorine atom. Each of $R^{49}$, $R^{50}$, $R^{51}$ and $R^{52}$ is hydrogen, fluorine, methyl or trifluoromethyl, with $R^{49}$ to $R^{52}$ containing at least one fluorine atom.

In the resist composition of the invention, any conventional photoacid generator other than the photoacid generator capable of generating a perfluoroalkyl ether sulfonic acid, specifically the sulfonium and iodonium salts of formula (1) may also be formulated.

Photoacid generator

The additional photoacid generator which can be used herein includes the following:

(i) onium salts of the formula (P1a-1) (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail. (i) Onium salts of formula (P1a-1), (P1a-2) or (P1b):

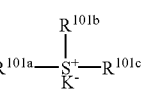
Pla-1

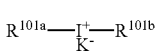
Pla-2

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. K⁻ is a non-nucleophilic counter ion excluding those of formulae (1), (2) and (3).

R$^{101a}$, R$^{101b}$, and R$^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexy-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxyalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by K⁻ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonic, and alkylsulfonate ions such as mesylate and butanesulfonate.

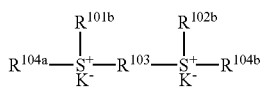

P1b

Herein, R$^{102a}$ and R$^{102b}$ independently represent straight, branched or cyclic alkyl groups of 1 to 8 carbon atoms. R$^{103}$ represents a straight, branched or cyclic alkylene groups of 1 to 10 carbon atoms. R$^{104a}$ and R$^{104b}$ independently represent 2-oxoalkyl groups of 3 to 7 carbon atoms. K⁻ is a non-nucleophilic counter ion.

Illustrative of the groups represented by R$^{102a}$ and R$^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by R$^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represents by R$^{104a}$ and R$^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1a-1) and (P1a-2).

(ii) Diazomethane derivatives of formula (P2)

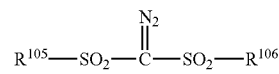

P2

Herein, R$^{105}$ and R$^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by R$^{105}$ and R$^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norboryl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl, (iii) Glyoxime derivatives of formula (P3)

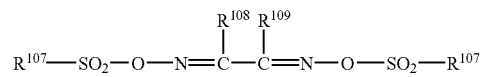

P3

Herein, R$^{107}$, R$^{108}$, and R$^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, R$^{108}$ and R$^{109}$, taken together, may form a ring. R$^{108}$ and R$^{109}$ each are straight or branched alkylene groups of 1 to 6 carbon atoms when they form a ring.

Illustrative examples of the alkyl, halogenated alkyl, aryl, halogenated aryl, and aralkyl groups represented by R$^{107}$, R$^{108}$, and R$^{109}$ are the same as exemplified for R$^{105}$ and R$^{106}$. Examples of the alkylene groups represented by R$^{108}$ and R$^{109}$ include methylene, ethylene, propylene, butylene, and hexylene.

(iv) Bissulfone derivatives of formula (P4)

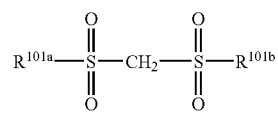

P4

Herein, R$^{101a}$ and R$^{101b}$ are as defined above.

(v) Sulfonic acid esters of N-hydroxyimide compounds of formula (P5)

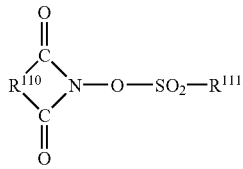

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, 1,2-ethylene, 1,3-propylene, 1,4-butylene, 1-phenyl-1,2-ethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxyphropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutyoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazonmethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsufonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivative such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsufonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of the two or more thereof. Onium salts are effective for improving rectangularity, wile diazomethane derivatives and glyoxime derivatives are effective for reducing standing waves. The combination of an onium salt with a diazomethane or a glyoxime derivative allows for fine adjustment of the profile.

The amount of the photoacid generators, that is, the amount of the photoacid generator capable of generating a perfluoroalkyl ether sulfonic acid, especially the onium salt of formula (1) plus the conventional photoacid generator combined is preferably about 0:1 to 15 parts, and especially about 0.5 to 8 parts by weight, per 100 parts by weight of the base resin. Less than 0.1 part of the photoacid generators would provide a poor sensitivity whereas more than 15 parts of the photoacid generators would lower the transparency and resolution of resist compositions.

Organic solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethylether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethylether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether and 1-ethoxy-2-propanol because the photoacid generator is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Dissolution inhibitor

A dissolution inhibitor may be added to the resist composition. Typical dissolution inhibitors are compounds having an average molecular weight within a range of 100 to 1,000, and preferably 150 to 800, and bearing on the molecule at least two phenolic hydroxyl groups in which 0 to 100 mol %, on the average, of the hydrogen atoms of the phenolic hydroxyl groups are substituted with acid labile groups, and compounds having a similar average molecular weight and bearing on the molecule at least one carboxyl group in which 80 to 100 mol %, on the average, of the hydrogen atoms of the carboxyl groups are substituted with acid labile groups.

It is noted that the percent substitution of hydrogen atoms of phenolic hydroxyl groups or carboxyl groups with acid labile groups is, on the average, at least 0 mol %, preferably at least 30 mol %, based on the entire phenolic hydroxyl groups or carboxyl groups, with the upper limit of percent substitution being 100 mol %, preferably 80 mol %.

Preferable examples of such compounds having two or more phenolic hydroxyl groups or compounds having one or more carboxyl groups include those of formulas (D1) to (D14) below.

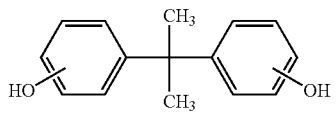

D1

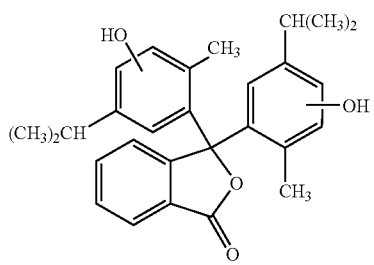

D2

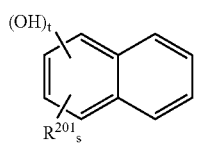

D3

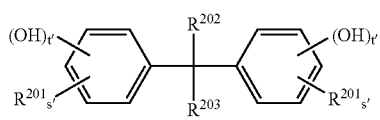

D4

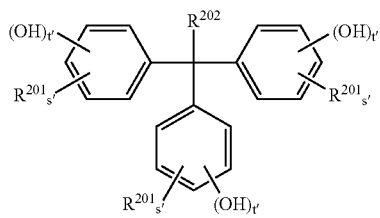

D5

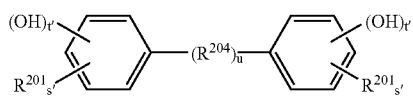

D6

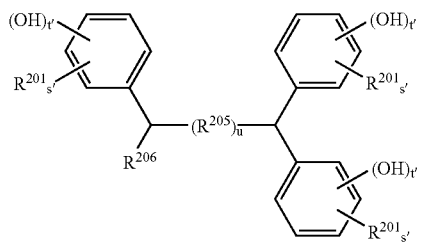

D7

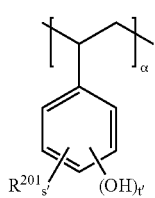

D8

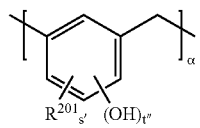

D9

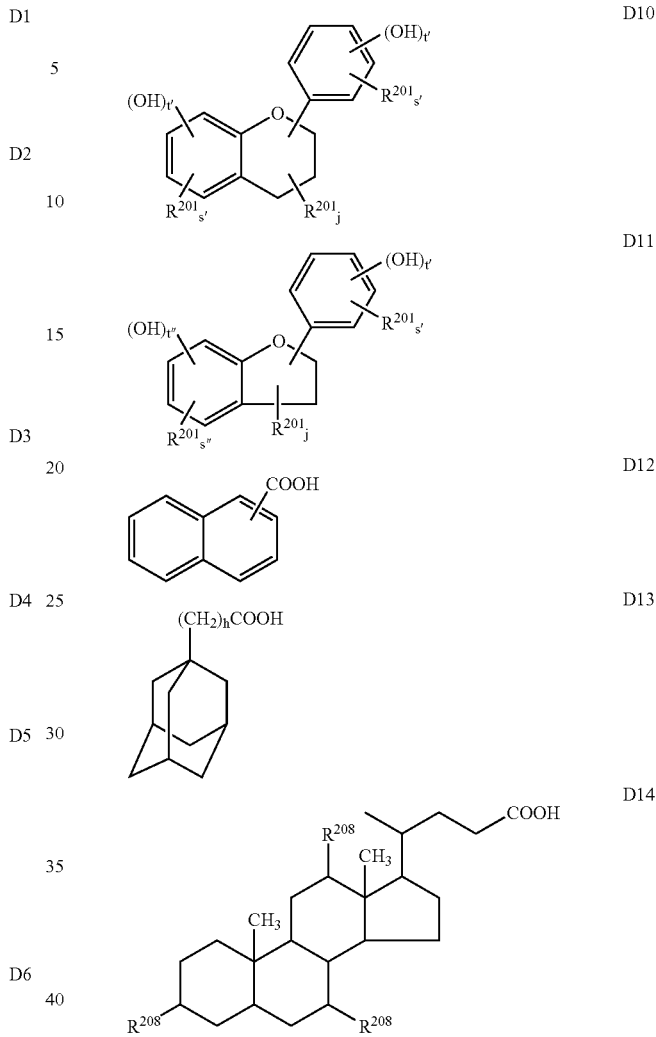

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or —$(R^{207})_h$—COOH; $R^{204}$ is —$(CH_2)_i$— (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 to 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) may have a molecular weight of 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —$CH_2$COOH; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

Exemplary acid labile groups on the dissolution inhibitor include groups of the following general formulae (L1) to (L5), tertiary alkyl groups of 4 to 20 carbon atoms, trialkylsilyl groups in which each of the alkyls has 1 to 6 carbon atoms, and oxoalkyl groups of 4 to 20 carbon atoms.

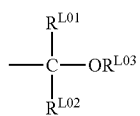

(L1)

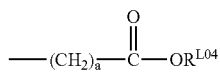

(L2)

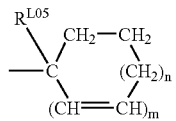

(L3)

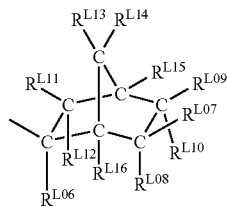

(L4)

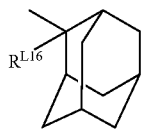

(L5)

herein, $R^{L01}$ to $R^{L16}$, a, m and n are as defined and exemplified above.

The dissolution inhibitor may be formulated in an amount of 0 to about 50 parts, preferably about 5 to 50 parts, and more preferably about 10 to 30 parts by weight, per 100 parts by weight of the base resin, and may be used singly or as a mixture of two or more thereof. Less than 5 parts of the dissolution inhibitor may fail to yield an improved resolution, whereas the use of more than 50 parts would lead to slimming of the patterned film, and thus a decline in resolution.

The dissolution inhibitor can be synthesized by introducing acid labile groups into a compound having phenolic hydroxyl or carboxyl groups in accordance with an organic chemical formulation.

Basic compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tertraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethlmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g. pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline an d3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid indolecarboxylic acid, and amino acid derivatives (e.g., nicotinic acid, alanine, alginine, aspartic acid, glutamic acid, glycine, histidine, isoleucine, glcylleucine, leucine, methionine, phenylalanine, threonine, lysine, 3-aminopyrazole-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogeneous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethyanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethyloxy) ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidine-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-diemthylformamide, acetamide, N-methylacetamide, N,N-dimethylacetamide, propionamide, and benzamide. Suitable imide derivatives include phthalimide, succinimide, and maleimide.

In addition, basic compounds of the following general formula (B1) may also be included alone or in admixutre.

$$N(X)_n(Y)_{3-n} \qquad B1$$

In the formula, n is equal to 1, 2 or 3; the side chain Y is independently hydrogen or a straight, branched or cyclic alkyl group of 1 to 20 carbon atoms which may contain a hydroxyl group or ether; and the side chain X is independently selected from groups of the following general formulas (X1) to (X3), and two or three X's may bond together to from a ring.

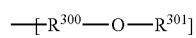  (X)-1

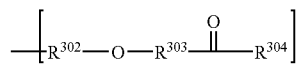  (X)-2

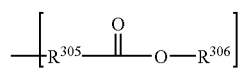  (X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups or 1 to 20 carbon atoms, which may contain at least one hydroxyl group, ether group, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether group, ester group or lactone ring.

Illustrative examples of the compounds of formula (B1) include tris(2-methoxymethoxyethyl)amine, tris(2-(2-methoxyethoxy)ethyl)amine, tris{2-(2-methoxyethoxymethoxy) ethyl}amine, tris{2-(1-methoxyethoxy)ethyl}amine, tris{2-(1-ethoxyethoxy)ethyl}amine, tris{2-(1-ethoxypropoxy) ethyl}amine, tris[2-{2-(2-hydroxyethoxy)ethoxy}ethyl] amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoza-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris (2-propionyloxyethyl)amine, tris(2-acetoxyethyl)amine, tris (2-propionyloxythyl)amine, tris(2-butyryloxyethyl)amine, tris(2-isobutyryloxyethyl)amine, tris(2-valeryloxyethyl) amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl) amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl] ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurufryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(2-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(2-hydroxy-1-propyl)-bis [2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethyl)ethyl]amine, N-methyl-bis(2-acetoxyethyl]amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamine)-δ-valerolactone.

Also useful are one or more of cyclic structure-bearing basic compounds having the following general formula (B2).

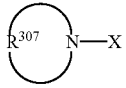
(B)-2

Herein X is as defined above, and $R^{307}$ is a straight or branched alkylene group of 2 to 20 carbon atoms which may contain one or more carbonyl groups, ether structures, ester structures or sulfide structures.

Illustrative examples of the cyclic structure-bearing basic compounds having formula (B2) include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B3) to (B6) may be blended.

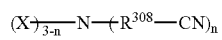
(B)-3

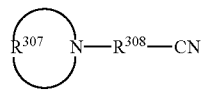
(B)-4

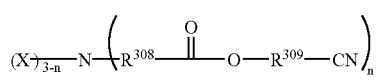
(B)-5

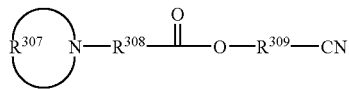
(B)-6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds having formulae (B3) to (B6) include 3-(diethylamino)propiononitrile, N,N-bis(2-hydroxyethyl)-3-aminopropiononitrile, N,N-bis(2-acetoxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminoproprionate, methyl N-cyanomethyl-N-(2-hydroxyethyl)-3-aminoproprionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 10 parts, and especially 0.01 to 1 part, per part of the photoacid generator. Less than 0.001 part of the basic compound may fail to achieve the desired effects thereof, while the use of more than 10 parts would result in too low a sensitivity and resolution.

Other components

In the resist composition, a compound bearing a ≡C—COOH group in a molecule may be blended. Exemplary, non-limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxy groups of the compounds of general formulas (A1) to (A10) below have been replaced with —$R^{401}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

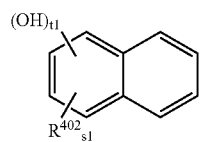
A1

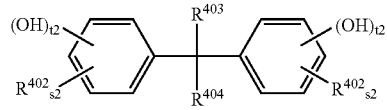
A2

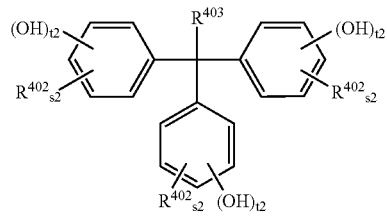
A3

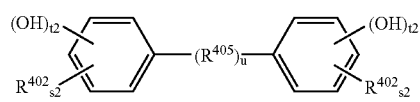
A4

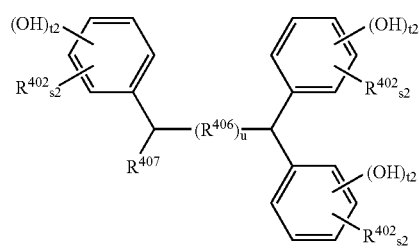
A5

-continued

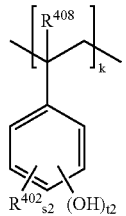
A6

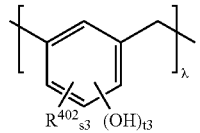
A7

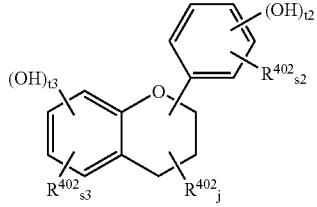
A8

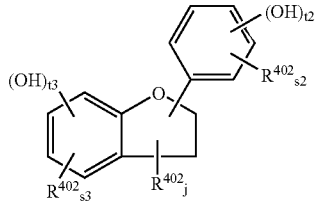
A9

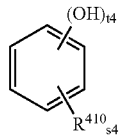
A10

In these formulas, $R^{408}$ is hydrogen or methyl; $R^{402}$ and $R^{403}$ are each hydrogen or a straight or branched alkyl or alkenyl of 1 to 8 carbon atoms; $R^{404}$ is hydrogen, a straight or branched alkyl or alkenyl of 1 to 8 carbon atoms, or a —$(R^{409})_n$—COOR' group (R' being hydrogen or —$R^{409}$—COOH); $R^{405}$ is —$(CH_2)_i$— (wherein i is 2 to 10), an arylene of 6 to 10 carbon atoms, carbonyl, sulfonyl, an oxygen atom, or a sulfur atom; $R^{406}$ is an alkylene of 1 to 10 carbon atoms, an arylene of 6 to 10 carbon atoms, carbonyl, sulfonyl, an oxygen atom, or a sulfur atom; $R^{407}$ is hydrogen, a straight or branched alkyl or alkenyl of 1 to 8 carbon atoms, or a hydroxyl-substituted phenyl or naphthyl; $R^{409}$ is a straight or branched alkylene of 1 to 10 carbon atoms; $R^{410}$ is hydrogen, a straight or branched alkyl or alkenyl of 1 to 8 carbon atoms, or a —$R^{411}$—COOH group; $R^{411}$ is a straight or branched alkylene of 1 to 10 carbon atoms; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; k is a number such that the compound of formula (A6) may have a weight average molecular weight of 1,000 to 5,000; and τ is a number such that the compound of formula (A7) may have a weight average molecular weight of 1,000 to 10,000.

Group II:
Compounds of general formulas (A11) to (A15) below.

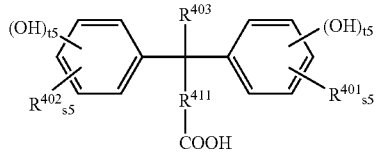
A11

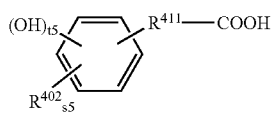
A12

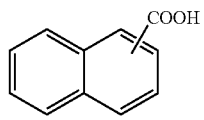
A13

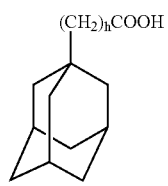
A14

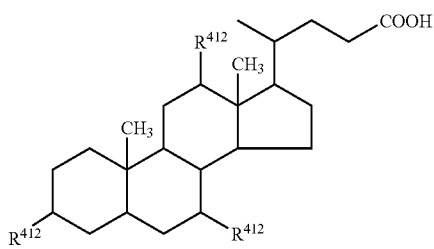
A15

In these formulas, $R^{402}$, $R^{403}$, and $R^{411}$ are as defined above; $R^{412}$ is hydrogen or hydroxyl; s5 and t5 are numbers which satisfy $s5 \leqq 0$, $t5 \leqq 0$, and $s5+t5=5$; and h' is equal to 0 to 1.

Illustrative, non-limiting examples of the compound bearing a ≡C—COOH group include compounds of the general formulas AI-1 to AI-4 and AII-1 to AII-10 below.

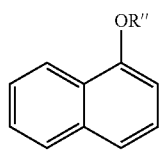
AI-1

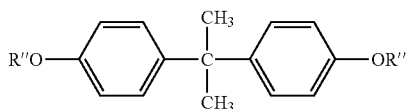
AI-2

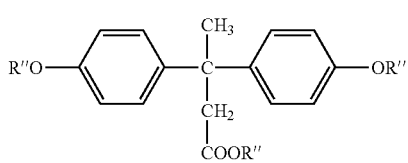
AI-3

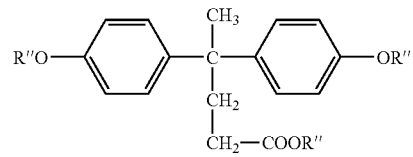
AI-4

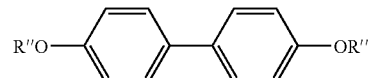
AI-5

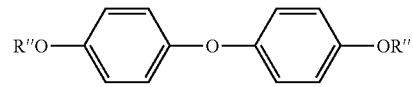
AI-6

AI-7

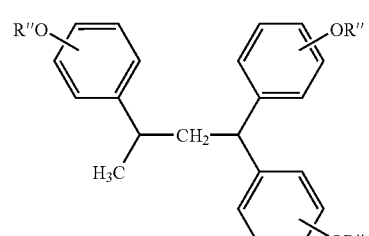
AI-8

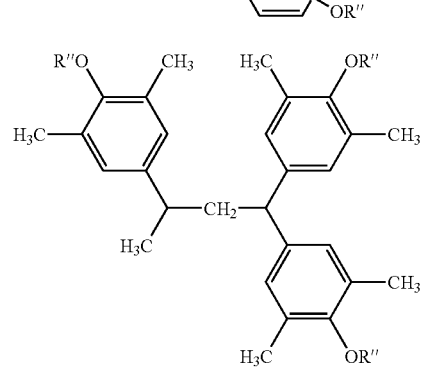
AI-9

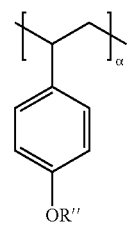
AI-10

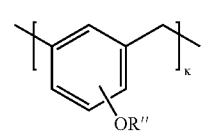
AI-11

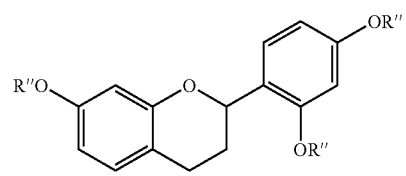
AI-12

-continued

AI-13

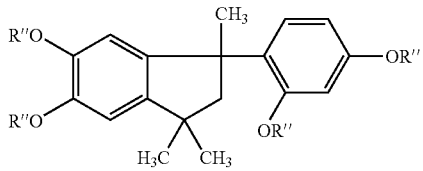

AI-14

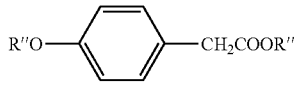

In the above formulas, R″ is hydrogen or a CH$_2$COOH group such that the CH$_2$COOH group accounts for 10 to 100 mol % of R″ in each compound, α and κ are as defined above.

AII-1

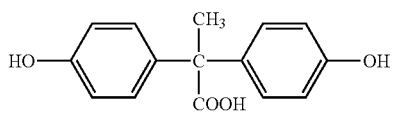

AII-2

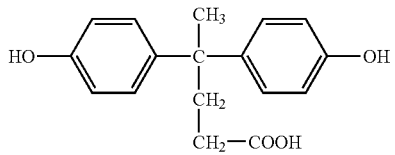

AII-3

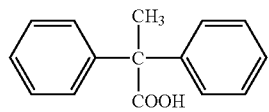

AII-4

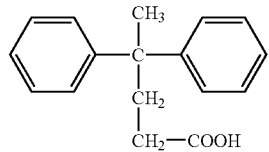

AII-5

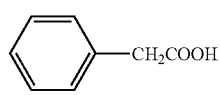

AII-6

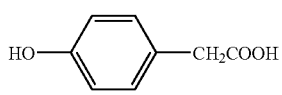

AII-7

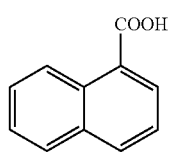

AII-8

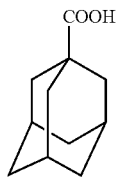

AII-9

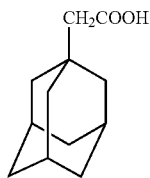

AII-10

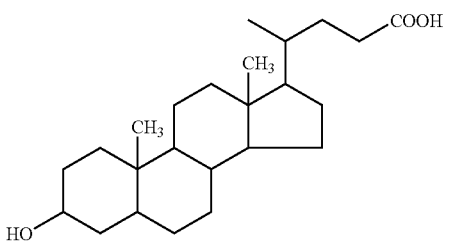

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The resist composition of the invention may additionally include an acetylene alcohol derivative for the purpose of improving storage stability. Preferred acetylene alcohol derivatives are those having the general formula (S1) or (S2) below.

S1

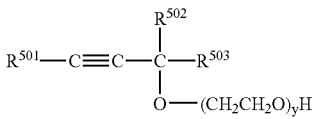

S2

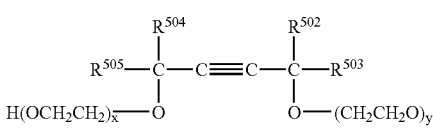

In the formulas, $R^{501}$, $R^{502}$, $R^{503}$, and $R^{505}$ are each hydrogen or a straight, branched, or cyclic alkyl of 1 to 8 carbon atoms; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and storage stability, whereas more than 2% by weight would result in a resist having a low resolution.

The resist composition of the invention may include, as an optional ingredient, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, flourinated alkyl esters, perfluoroalkylamine oxides, perfluoroalkyl EO-addition products, and fluorinated organosiloxane compounds. Useful surfactants are commercially available under the trade names Florade FC-430 and FC-431 from Sumitomo 3M Co., Ltd., Surflon S-141 and S-145 from Asahi Glass Co., Ltd., Unidyne DS-401, DS-403 and DS-451 from Daikin Industry Co., Ltd., Megaface F-8151 from Dai-Nippon Ink & Chemicals Co., Ltd., and X-70-092 and X-70-093 from Shin-Etsu Chemical Co., Ltd. Preferred surfactants are Florade FC-430 from Sumitomo 3M Co., Ltd., and X-70-093 from Shin-Etsu chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.3 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an ArF excimer laser beam in a dose of about 1 to 100 mJ/cm², and preferably about 5 to 50 mJ/cm², then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. The desired pattern may not be obtainable outside the upper and lower limits of the above range.

The resist composition comprising the photoacid generator according to the invention has many advantages including excellent resolution, minimized size difference between isolated and densely packed patterns, and minimized line edge roughness.

EXAMPLE

Examples of the invention are given below by way of illustration and not by way of limitation. The abbreviation Mw is a weight average molecular weight.

Example

Resist compositions using sulfonium and iodonium salts, designated PAG1 to PAG6, having the structural formulae shown below were evaluated for sensitivity and resolution.

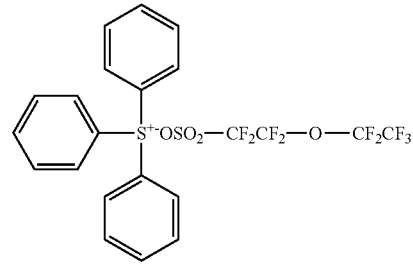
(PAG 1)

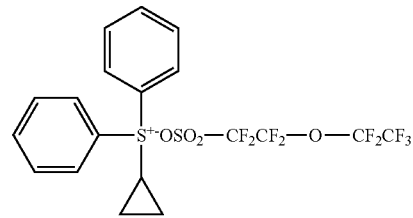
(PAG 2)

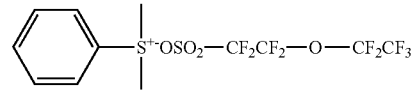
(PAG 3)

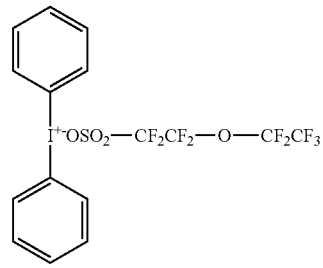
(PAG 4)

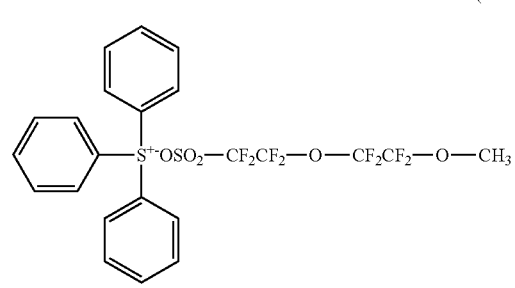
(PAG 5)

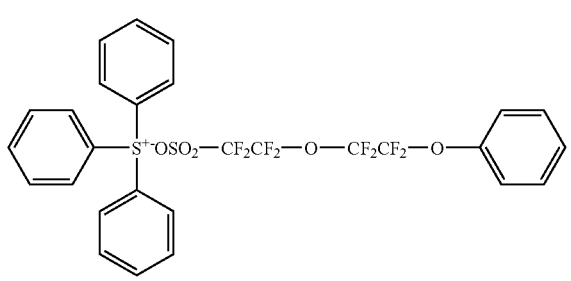
(PAG 6)

Examples 1–44

Resist resolution evaluation

Resist compositions were prepared by dissolving Polymers 1 to 8, shown below, as the base resin, a photoacid generator (PAG1 to 6), a dissolution inhibitor (DRR1 to 4), a basic compound, and a compound bearing a ≡C—COOH group in a molecule (ACC1 to 2) in a solvent in accordance with the formulation shown in Tables 1–3. These compositions were each filtered through a Teflon® filter (pore diameter 0.2 μm), thereby giving resist solutions.

(Polymer 1)

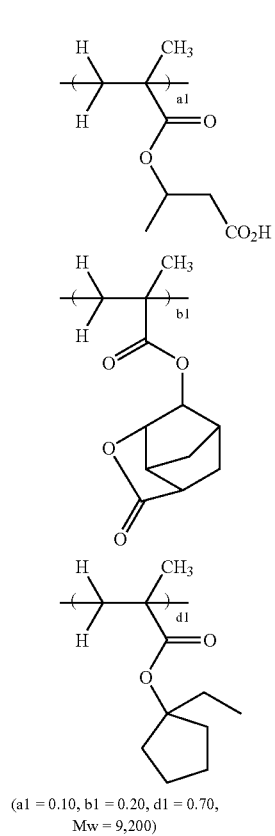

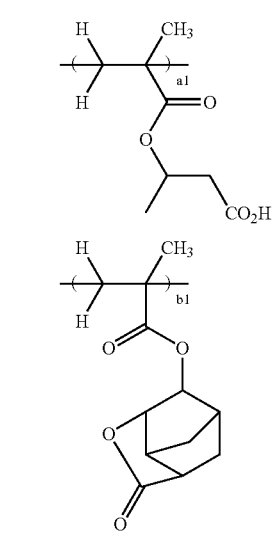

(a1 = 0.10, b1 = 0.20, d1 = 0.70, Mw = 9,200)

(Polymer 2)

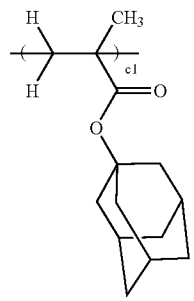

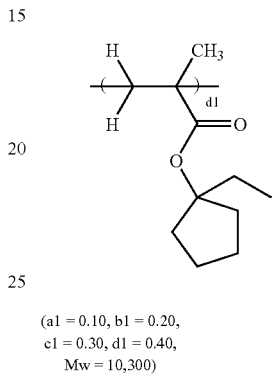

(a1 = 0.10, b1 = 0.20, c1 = 0.30, d1 = 0.40, Mw = 10,300)

(Polymer 3)

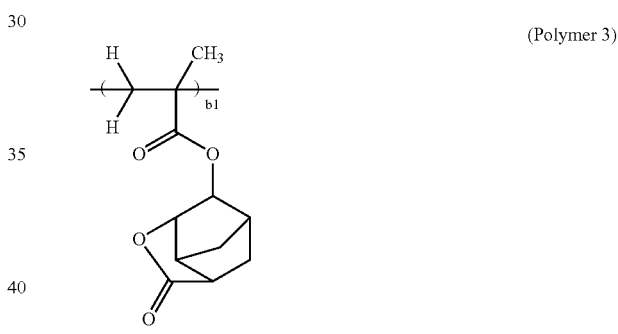

(b1 = 0.50, d1 = 0.50, Mw = 11,800)

(Polymer 4)

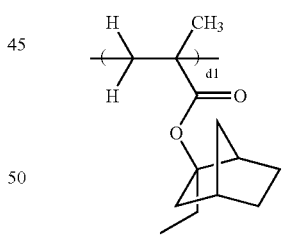

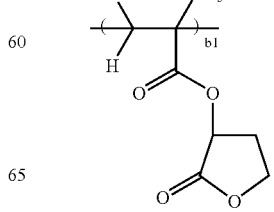

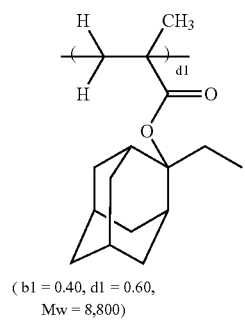
(b1 = 0.40, d1 = 0.60,
Mw = 8,800)
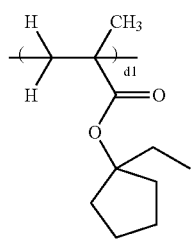
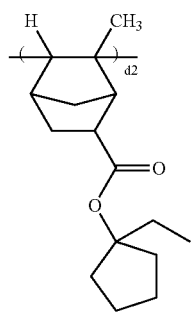
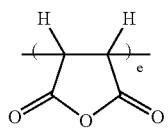
(d1 = 0.30, d2 = 0.35, e = 0.35,
Mw = 10,500)
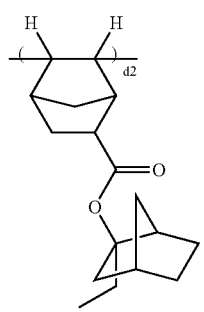
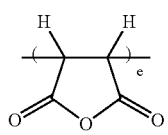
(d2 = 0.50, e = 0.50,
Mw = 8,300)
(Polymer 5)
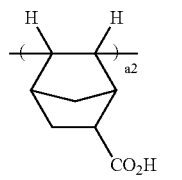
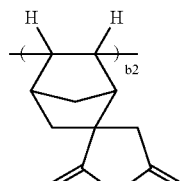
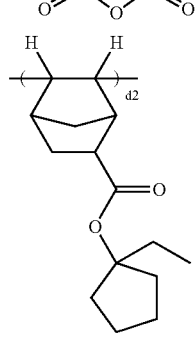
(a2 = 0.10, b2 = 0.30, d1 = 0.60,
Mw = 27,600)
(Polymer 6)
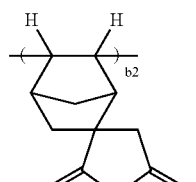
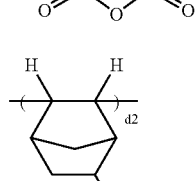
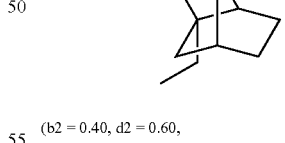
(b2 = 0.40, d2 = 0.60,
Mw = 18,300)
(Polymer 7)
(Polymer 8)
(Polymer 9)
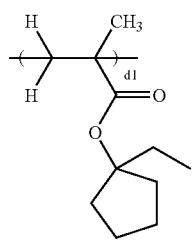

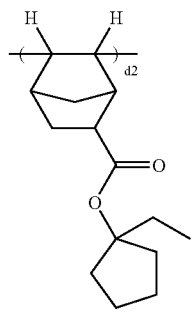
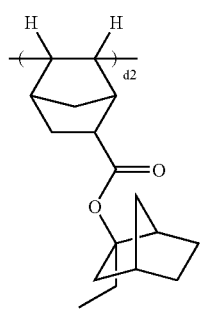
(d1 = 0.30, d2 = 0.35, e = 0.35,
Mw = 10,500)
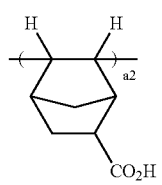
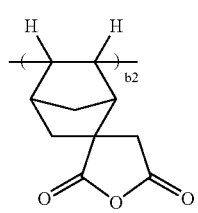
(d2 = 0.50, e = 0.50,
Mw = 8,300)
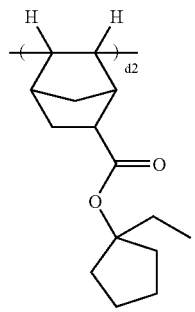
(a2 = 0.10, b2 = 0.30, d1 = 0.60,
Mw = 27,600)
(Polymer 10)
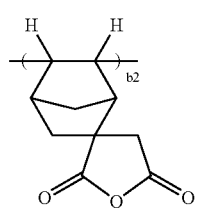
(Polymer 11)
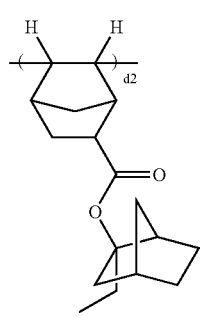
(b2 = 0.40, d2 = 0.60,
Mw = 18,300)
(Polymer 12)
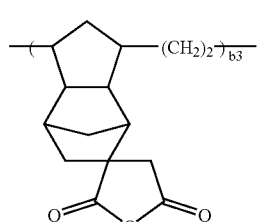
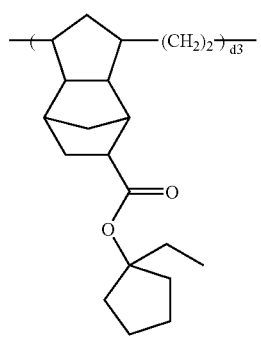
(b3 = 0.40, d3 = 0.60,
Mw = 29,100)
(Polymer 13)

-continued
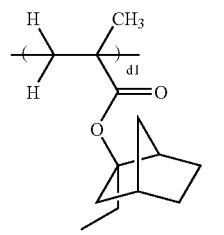
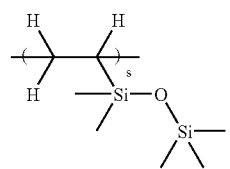
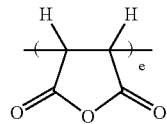
(d1 = 0.40, S = 0.20, e = 0.40, Mw = 10,200)
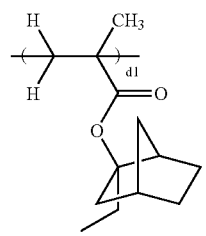
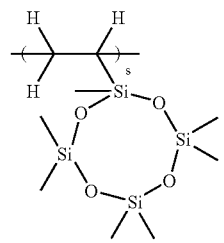
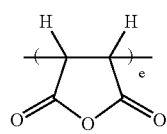
(d1 = 0.45, S = 0.10, e = 0.45, Mw = 12,200)
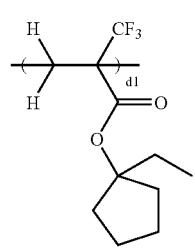
(Polymer 14)
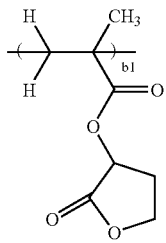
(d1 = 0.50, b1 = 0.50, Mw = 10,500)
(Polymer 15)
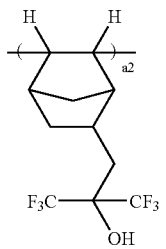
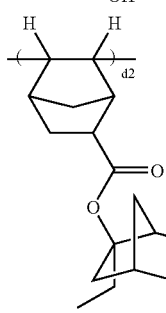
(a2 = 0.50, d2 = 0.50, Mw = 14,300)
(Polymer 16)
(Polymer 17)
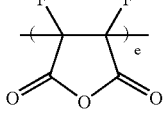
(Polymer 18)
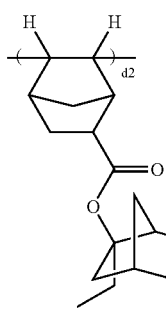
(d2 = 0.50, e = 0.50, Mw = 8,600)
(DRR 1)
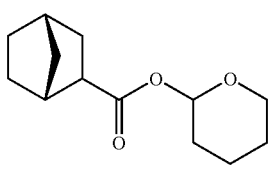

-continued

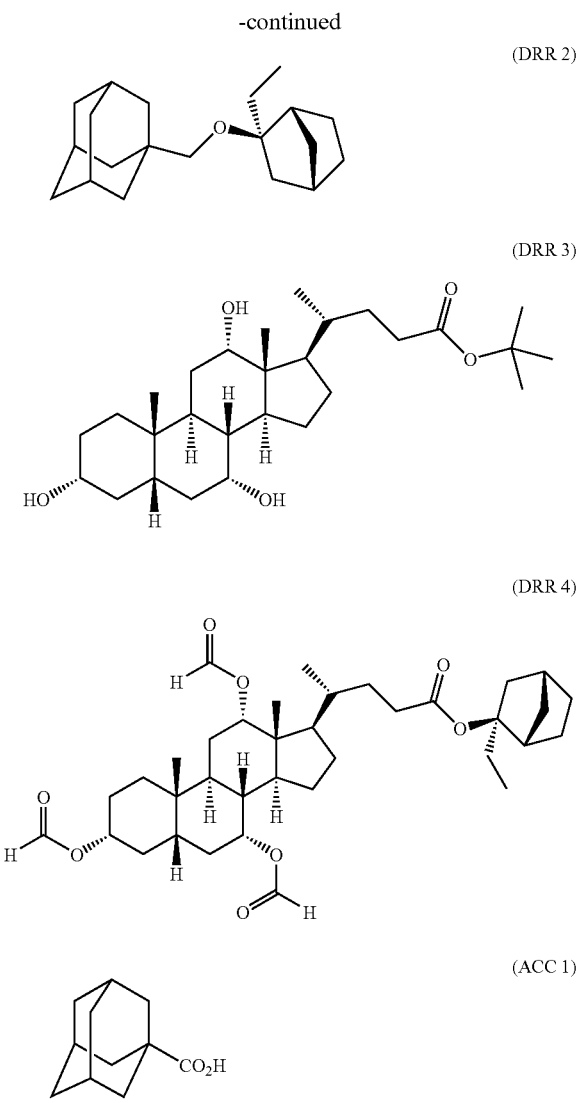

(DRR 2)
(DRR 3)
(DRR 4)
(ACC 1)

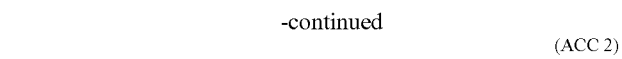

(ACC 2)

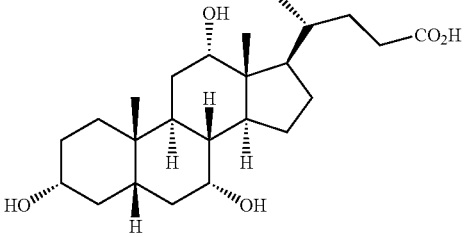

On silicon substrates, an antireflection film solution (AR-19 by Shipley Co.) was applied and baked at 200° C. for 60 seconds to form an antireflection film of 82 nm thick. The resist solutions were spin coated onto the antireflection film-bearing silicon substrates, then baked on a hot plate at 130° for 60 seconds to give resist films having a thickness of 300 nm. The resist films were exposed using an ArF excimer laser micro-stepper (Nikon corporation; NA 0.55), then baked (PEB) at 110° C. for 60 seconds, and developed with a solution of 2.38% tetramethylammonium hydroxide in water for 30 seconds, thereby giving line-and-space patterns.

The optimal exposure (Eop, mJ/cm$^2$) was defined as the exposure dose which provided a 1:1 resolution to a line-and-space pattern of 0.20 μm group. The resolution of the resist under evaluation was defined as the minimum line width (μm) of the lines and spaces that separated at the optimal exposure. The width of an isolated line in a 1:10 line-and-space pattern at the same exposure was measured, and the width of an isolated line subtracted from the width of the grouped lines was the size difference between isolated and densely packed patterns (I/G bias). The group lines were examined for roughness, which was reported as line edge roughness.

The composition and test results of the resist materials are shown in Tables 1–3. The solvents and basic compounds used are as follows. It is noted that the solvents contained 0.01% by weight of surfactant FC-430 (Sumitomo-3M Co., Ltd.).

TABLE 1

| Example | Resin (pbw) | Photoacid generator (pbw) | Dissolution inhibitor (pbw) | Basic compound (pbw) | Solvent (pbw) | Sensitivity (mJ/cm$^2$) | Resolution, μm | I/G bias (nm) | Line edge roughness (nm) |
|---|---|---|---|---|---|---|---|---|---|
| 1 | Polymer 5 (80) | PAG 1 (1.5) | — | TBA (0.10) | PGMEA (480) | 35.0 | 0.15 | 30 | 5.0 |
| 2 | Polymer 5 (80) | PAG 2 (1.5) | — | TBA (0.10) | PGMEA (480) | 31.0 | 0.15 | 32 | 6.0 |
| 3 | Polymer 5 (80) | PAG 3 (1.5) | — | TBA (0.10) | PGMEA (480) | 28.0 | 0.15 | 35 | 6.3 |
| 4 | Polymer 5 (80) | PAG 4 (1.5) | — | TBA (0.10) | PGMEA (480) | 45.0 | 0.15 | 25 | 7.2 |
| 5 | Polymer 5 (80) | PAG 5 (2) | — | TBA (0.10) | PGMEA (480) | 42.0 | 0.15 | 22 | 8.2 |
| 6 | Polymer 5 (80) | PAG 6 (2) | — | TBA (0.10) | PGMEA (480) | 50.0 | 0.16 | 36 | 8.5 |
| 7 | Polymer 5 (80) | PAG 1 (1.5) | — | TBA (0.10) | CyHO (560) | 33.0 | 0.15 | 33 | 4.8 |
| 8 | Polymer 1 (80) | PAG 1 (1.5) | — | TBA (0.10) | CyHO (560) | 18.0 | 0.16 | 25 | 3.2 |
| 9 | Polymer 2 (80) | PAG 1 (1.5) | — | TBA (0.10) | CyHO (560) | 22.0 | 0.16 | 20 | 3.6 |
| 10 | Polymer 3 (80) | PAG 1 (1.5) | — | TBA (0.10) | CyHO (560) | 15.0 | 0.15 | 38 | 2.2 |

TABLE 1-continued

| Example | Resin (pbw) | Photoacid generator (pbw) | Dissolution inhibitor (pbw) | Basic compound (pbw) | Solvent (pbw) | Sensitivity (mJ/cm$^2$) | Resolution, μm | I/G bias (nm) | Line edge roughness (nm) |
|---|---|---|---|---|---|---|---|---|---|
| 11 | Polymer 4 (80) | PAG 1 (1.5) | — | TBA (0.10) | CyHO (560) | 25.0 | 0.15 | 28 | 5.9 |
| 12 | Polymer 6 (80) | PAG 1 (1.5) | — | TBA (0.10) | CyHO (560) | 39.0 | 0.17 | 32 | 6.3 |
| 13 | Polymer 7 (80) | PAG 1 (1.5) | — | TBA (0.10) | CyHO (560) | 25.0 | 0.15 | 28 | 5.6 |
| 14 | Polymer 8 (80) | PAG 1 (1.5) | — | TBA (0.10) | CyHO (560) | 22.0 | 0.15 | 32 | 6.3 |
| 15 | Polymer 9 (80) | PAG 1 (1.5) | — | TBA (0.10) | CyHO (560) | 22.0 | 0.18 | 45 | 3.2 |
| 16 | Polymer 10 (80) | PAG 1 (1.5) | — | TBA (0.10) | CyHO (560) | 19.0 | 0.16 | 50 | 6.6 |
| 17 | Polymer 11 (80) | PAG 1 (1.5) | — | TBA (0.10) | CyHO (560) | 28.0 | 0.16 | 56 | 5.5 |
| 18 | Polymer 12 (80) | PAG 1 (1.5) | — | TBA (0.10) | CyHO (560) | 15.0 | 0.18 | 62 | 5.8 |
| 19 | Polymer 13 (80) | PAG 1 (1.5) | — | TBA (0.10) | CyHO (560) | 19.0 | 0.18 | 69 | 5.5 |

PGMEA: propylene glycol methyl ether acetate
CyHO: cyclohexanone
PG/EL: a mixture of 70% PGMEA and 30% ethyl lactate
TBA: tributylamine
TEA: triethanol amine
TMMEA: trismethoxymethoxyethylamine
TMEMEA: trismethoxyethoxymethoxyethylamine
AAA: tris(2-acetoxyethyl)amine
AACN: N,N-bis(2-acetoxyethyl)-3-aminopropiononitrile

TABLE 2

| Example | Resin (pbw) | Photoacid generator (pbw) | Dissolution inhibitor (pbw) | Basic compound (pbw) | Solvent (pbw) | Sensitivity (mJ/cm$^2$) | Resolution, μm | I/G bias (nm) | Line edge roughness (nm) |
|---|---|---|---|---|---|---|---|---|---|
| 20 | Polymer 14 (80) | PAG 1 (1.5) | — | TBA (0.10) | CyHO (560) | 29.0 | 0.15 | 32 | 8.8 |
| 21 | Polymer 15 (80) | PAG 1 (1.5) | — | TBA (0.10) | CyHO (560) | 32.0 | 0.15 | 25 | 9.8 |
| 22 | Polymer 16 (80) | PAG 1 (1.5) | — | TBA (0.10) | CyHO (560) | 26.0 | 0.15 | 33 | 8.8 |
| 23 | Polymer 17 (80) | PAG 1 (1.5) | — | TBA (0.10) | CyHO (560) | 29.0 | 0.17 | 75 | 5.6 |
| 24 | Polymer 18 (80) | PAG 1 (1.5) | — | TBA (0.10) | CyHO (560) | 25.0 | 0.18 | 65 | 5.1 |
| 25 | Polymer 5 (80) | PAG 3 (1.5) | — | TEA (0.10) | CyHO (560) | 30.0 | 0.15 | 63 | 4.8 |
| 26 | Polymer 5 (80) | PAG 3 (1.5) | — | TMMEA (0.13) | CyHO (560) | 25.0 | 0.15 | 62 | 4.7 |
| 27 | Polymer 5 (80) | PAG 3 (1.5) | — | TMEMEA (0.20) | CyHO (560) | 26.0 | 0.15 | 61 | 4.6 |
| 28 | Polymer 5 (80) | PAG 3 (1.5) | — | AAA (0.10) | CyHO (560) | 30.0 | 0.14 | 55 | 4.1 |
| 29 | Polymer 5 (80) | PAG 3 (1.5) | — | AACN (0.10) | CyHO (560) | 32.0 | 0.14 | 52 | 4.8 |
| 30 | Polymer 7 (80) | PAG 3 (1.5) | — | TEA (0.10) | CyHO (560) | 23.0 | 0.15 | 36 | 4.4 |
| 31 | Polymer 7 (64) | PAG 3 (1.5) | DRR 1 (16) | TEA (0.10) | CyHO (560) | 20.0 | 0.15 | 40 | 3.8 |
| 32 | Polymer 7 (64) | PAG 3 (1.5) | DRR 2 (16) | TEA (0.10) | CyHO (560) | 19.0 | 0.15 | 42 | 3.3 |
| 33 | Polymer 7 (64) | PAG 3 (1.5) | DRR 3 (16) | TEA (0.10) | CyHO (560) | 22.0 | 0.15 | 41 | 3.6 |
| 34 | Polymer 7 (64) | PAG 3 (1.5) | DRR 4 (16) | TEA (0.10) | CyHO (560) | 22.0 | 0.15 | 50 | 3.6 |
| 35 | Polymer 4 (80) | PAG 5 (2) | — | TEA (0.10) | CyHO (560) | 35.0 | 0.15 | 25 | 5.5 |

TABLE 2-continued

| Example | Resin (pbw) | Photoacid generator (pbw) | Dissolution inhibitor (pbw) | Basic compound (pbw) | Solvent (pbw) | Sensitivity (mJ/cm$^2$) | Resolution, μm | I/G bias (nm) | Line edge roughness (nm) |
|---|---|---|---|---|---|---|---|---|---|
| 36 | Polymer 4 (80) | PAG 5 (2) | ACC 1 (2) | TEA (0.10) | CyHO (560) | 30.0 | 0.15 | 29 | 5.2 |
| 37 | Polymer 4 (80) | PAG 5 (2) | ACC 2 (2) | TEA (0.10) | CyHO (560) | 29.0 | 0.15 | 32 | 5.5 |
| 38 | Polymer 8 (80) | PAG 6 (2) | — | TEA (0.10) | PGMEA (480) | 30.0 | 0.16 | 26 | 5.5 |
| 39 | Polymer 8 (80) | PAG 6 (2) | ACC 1 (2) | TEA (0.10) | PGMEA (480) | 29.0 | 0.16 | 32 | 4.4 |

TABLE 3

| Example | Resin (pbw) | Photoacid generator (pbw) | Dissolution inhibitor (pbw) | Basic compound (pbw) | Solvent (pbw) | Sensitivity (mJ/cm$^2$) | Resolution, μm | I/G bias (nm) | Line edge roughness (nm) |
|---|---|---|---|---|---|---|---|---|---|
| 40 | Polymer 8 (80) | PAG 6 (2) | ACC 2 (2) | TEA (0.10) | PGMEA (480) | 27.0 | 0.16 | 33 | 4.8 |
| 41 | Polymer 3 (40) Polymer 5 (40) | PAG 1 (1.5) | — | TEA (0.10) | PG/EL (480) | 18.0 | 0.16 | 33 | 6.3 |
| 42 | Polymer 3 (40) Polymer 5 (40) | PAG 3 (1.5) | — | TEA (0.10) | PG/EL (480) | 16.0 | 0.16 | 38 | 5.2 |
| 43 | Polymer 5 (40) Polymer 7 (40) | PAG 1 (1.5) | — | TEA (0.10) | CyHO (560) | 31.0 | 0.15 | 35 | 4.4 |
| 44 | Polymer 5 (40) Polymer 7 (40) | PAG 3 (1.5) | — | TEA (0.10) | CyHO (560) | 28.0 | 0.15 | 33 | 6.6 |

Comparative Example

Resist compositions using sulfonium salts, designated PAG7 to PAG12, having the structural formulae shown below were evaluated for sensitivity and resolution.

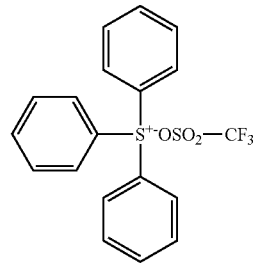
(PAG 7)

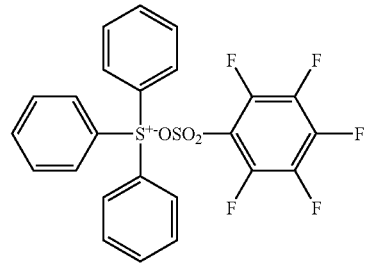
(PAG 8)

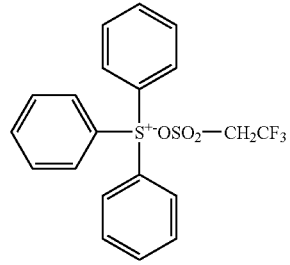
(PAG 9)

(PAG 10)

-continued

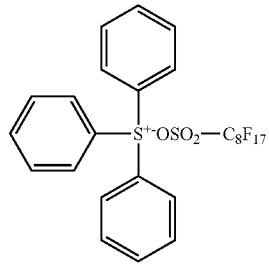

(PAG 11)

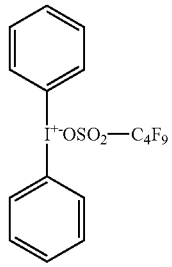

(PAG 12)

Comparative Examples 1–6

Aside from using the sulfonium salts PAG7 to PAG12, resist compositions were prepared as in Example in accordance with the formulation shown in Table 4 and similarly evaluated for sensitivity and resolution.

The composition and test results of the resist materials are shown in Table 4.

TABLE 4

| Comparative Example | Resin (pbw) | Photoacid generator (pbw) | Dissolution inhibitor (pbw) | Basic compound (pbw) | Solvent (pbw) | Sensitivity (mJ/cm²) | Resolution, μm | I/G bias (nm) | Line edge roughness (nm) |
|---|---|---|---|---|---|---|---|---|---|
| 1 | Polymer 5 (80) | PAG 7 (1) | — | TBA (0.10) | PGMEA (480) | 9.1 | 0.16 | 95 | 5.8 |
| 2 | Polymer 5 (80) | PAG 8 (1) | — | TBA (0.10) | PGMEA (480) | 9.9 | 0.16 | 116 | 4.9 |
| 3 | Polymer 5 (80) | PAG 9 (1) | — | TBA (0.10) | PGMEA (480) | 9.0 | 0.16 | 30 | 9.5 |
| 4 | Polymer 5 (80) | PAG 10 (1) | — | TBA (0.10) | PGMEA (480) | 9.4 | 0.16 | 122 | 4.3 |
| 5 | Polymer 5 (80) | PAG 11 (1) | — | TBA (0.10) | PGMEA (480) | 8.9 | 0.16 | 25 | 15.5 |
| 6 | Polymer 5 (80) | PAG 12 (1) | — | TBA (0.10) | PGMEA (480) | 9.2 | 0.16 | 28 | 13.2 |

It is seen from Tables 1 to 4 that inventive resist compositions are improved in sensitivity, resolution and storage stability over the prior art resist compositions.

Japanese Patent Application No. 2001-254293 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base resin which is a high molecular weight structure free from an aromatic substituent group, a photoacid generator, and a solvent, said photoacid generator having the general formula (3):

$$(R^{01})_n M^+ R^{02}\text{—O—}Rf^3\text{—O—}CF_2CF_2SO_3^- \quad (3)$$

wherein each $R^{01}$ is independently a straight, branched or cyclic $C_1$–$C_{20}$ alkyl group which optionally comprises a halogen atom or carbonyl, ester, thioether or ether group, a $C_6$–$C_{20}$ aryl group or a $C_7$–$C_{20}$ aralkyl group; $M^+$ is iodonium or sulfonium; b is 2 or 3; $R^{02}$ is hydrogen or a straight, branched or cyclic $C_1$–$C_{18}$ alkyl, or an aryl or aralkyl group; $Rf^3$ is a divalent, straight or branched $C_1$–$C_4$ hydrocarbon group in which some or all of the hydrogen atoms may be substituted with fluorine atoms.

2. The resist composition of claim 1, wherein said base resin comprises at least one polymer selected from the group consisting of polyacrylic acid or a derivative thereof, a ternary, quaternary or multimeric copolymer of a cycloolefin derivative-maleic anhydride alternating copolymer and polyacrylic acid or a derivative thereof, a ternary, quaternary or multimeric copolymer of a cycloolefin derivative-maleimide alternating copolymer and polyacrylic acid or a derivative thereof, polynorbornene, and a metathesis ring-opening polymer.

3. The resist composition of claim 1, wherein said base resin is a silicon-containing high molecular weight structure.

4. The resist composition of claim 1, wherein said base resin is a fluorine-containing high molecular weight structure.

5. A resist composition according to claim 2, which is a positive resist composition, wherein the photoacid generator is capable of generating an acid, and the base resin is insoluble or substantially insoluble in a developer, but becomes soluble in a developer under the action of the acid.

6. The chemically amplified positive resist composition of claim 5 further comprising a basic compound.

7. The chemically amplified positive resist composition of claim 5 further comprising a dissolution inhibitor.

8. A process for forming a resist pattern comprising the steps of:

applying the resist composition of claim 1 onto a substrate to form a coating, heat treating the coating and then exposing it to high-energy radiation having a wavelength of up to 200 nm through a photomask, and optionally heat treating the exposed coating and developing it with a developer.

9. A resist composition comprising a base resin which is a high molecular weight structure free from an aromatic substituent group, a photoacid generator, and a solvent, said base resin has at least one recurring unit selected from the group consisting of (7)-49

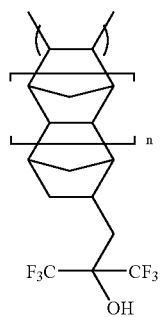

(7)-50

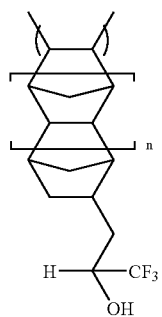

(7)-51

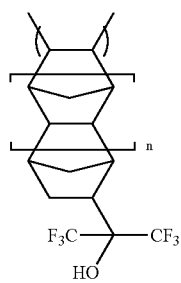

(7)-52

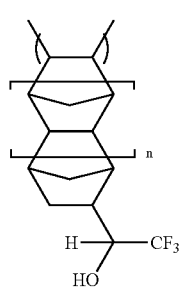

(7)-53

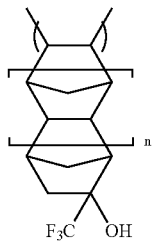

(7)-54

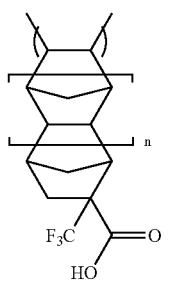

(10)-1

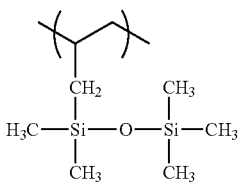

(10)-2

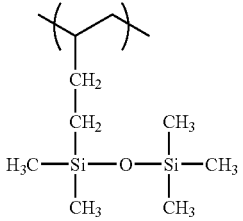

(10)-3

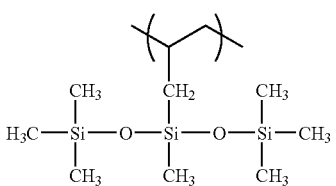

(10)-4

(10)-5

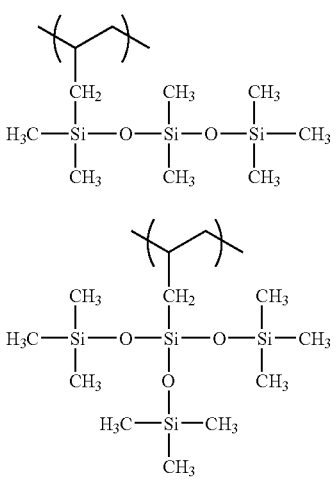

-continued
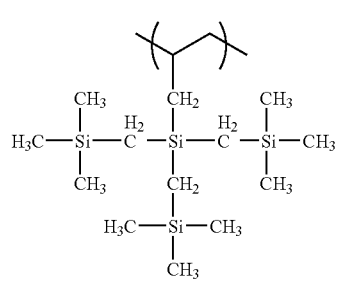 (10)-6
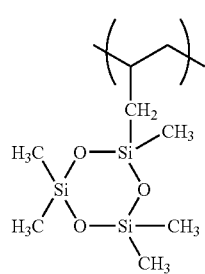 (10)-7
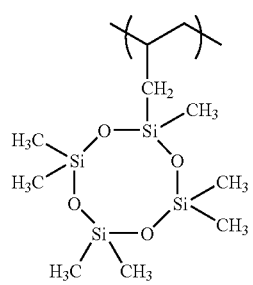 (10)-8
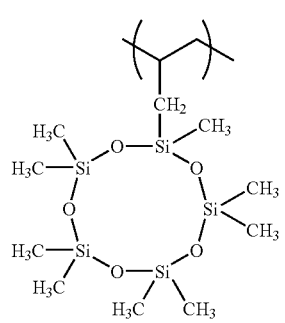 (10)-9
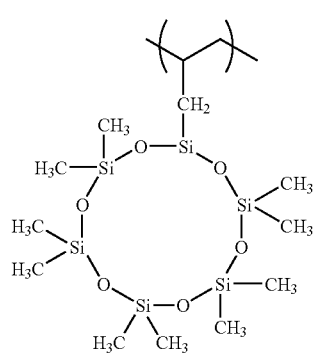 (10)-10
-continued
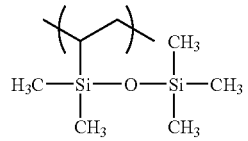 (10)-11
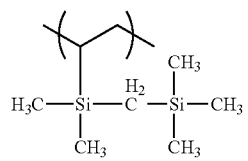 (10)-12
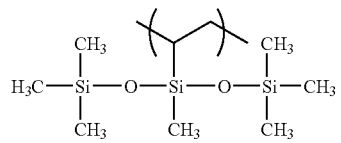 (10)-13
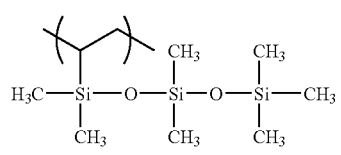 (10)-14
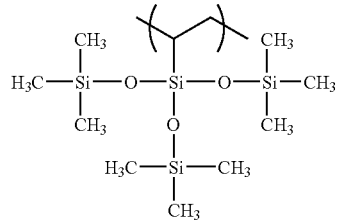 (10)-15
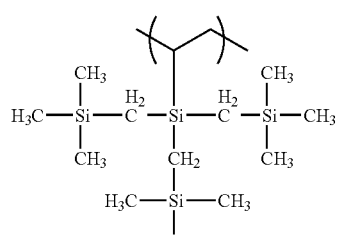 (10)-16
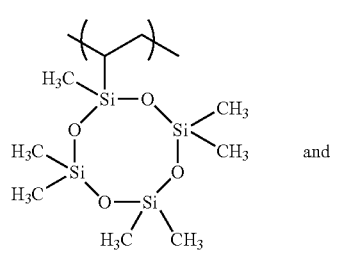 and (10)-17

-continued (10)-18

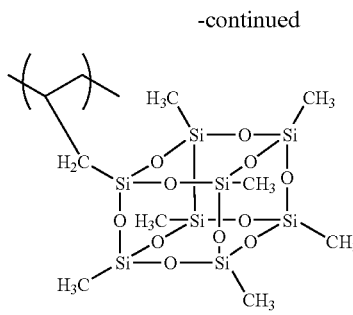

wherein n is 0 or 1, and
said photoacid generator having the general formula (3):

$$(R^{O1})_bM^+R^{O2}-O-Rf^3-O-CF_2CF_2SO_3^-\qquad(3)$$

wherein each $R^{O1}$ is independently a straight, branched or cyclic $C_1$–$C_{20}$ alkyl group which optionally comprises a halogen atom or carbonyl, ester, thioether or ether group, a $C_6$–$C_{20}$ aryl group or a $C_7$–$C_{20}$ aralkyl group; $M^+$ is iodonium or sulfonium; b is 2 or 3; $R^{O2}$ is hydrogen or a straight, branched or cyclic $C_1$–$C_{18}$ alkyl, or an aryl or aralkyl group; $Rf^3$ is a divalent, straight or branched $C_1$–$C_4$ hydrocarbon group in which some or all of the hydrogen atoms may be substituted with fluorine atoms.

10. A resist composition according to claim 9, which is a positive resist composition, wherein the photoacid generator is capable of generating an acid, and the base resin is insoluble or substantially insoluble in a developer, but becomes soluble in a developer under the action of the acid.

11. The chemically amplified positive resist composition of claim 10 further comprising a basic compound.

12. The chemically amplified positive resist composition of claim 10 further comprising a dissolution inhibitor.

13. A process for forming a resist pattern comprising the steps of:
applying the resist composition of claim 9 onto a substrate to form a coating,
heat treating the coating and then exposing it to high-energy radiation having a wavelength of up to 200 nm through a photomask, and
optionally heat treating the exposed coating and developing it with a developer.

14. The resist composition of claim 1, wherein each $R^{O1}$ is independently a straight, branched or cyclic alkyl group of 1 to 10 carbon atoms, which may comprise a halogen atom or carbonyl, ester, thioether or ether group, or is an aryl group of 6 to 12 carbon atoms, or an aralkyl group of 7 to 12 carbon atoms.

15. The resist composition of claim 14, wherein the aryl group is phenyl, xylyl, tolyl or naphthyl, and/or the aralkyl group is benzyl, phenylenethyl or phenylpropyl.

16. The resist composition of claim 1, wherein the sulfonate anion in formula (3) is a fluoroalkylsulfonic acid having at least one ether bond within the molecule.

17. The resist composition of claim 1, wherein the sulfonate anion in formula (3) is

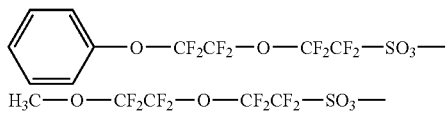

$$CH_3CH_2-O-CF_2CF_2-O-CF_2CF_2-SO_3-$$

$$CH_3CH_2CH_2-O-CF_2CF_2-O-CF_2CF_2-SO_3-\quad\text{or}$$

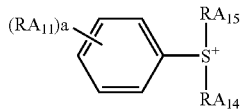

18. The resist composition of claim 1, wherein $Rf^3$ is alkylene.

19. The resist composition of claim 1, wherein the cation part of formula (3) is

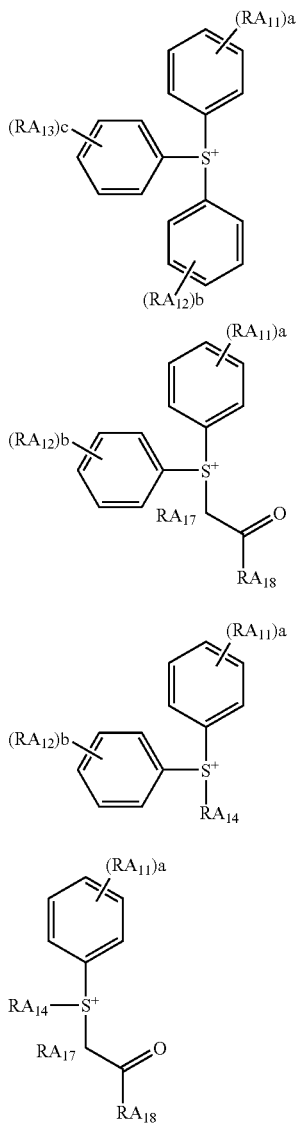

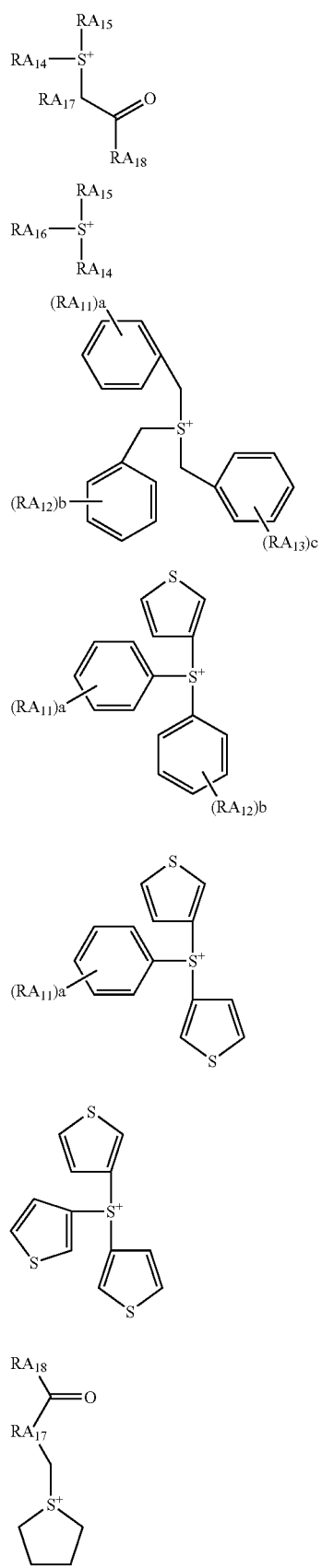
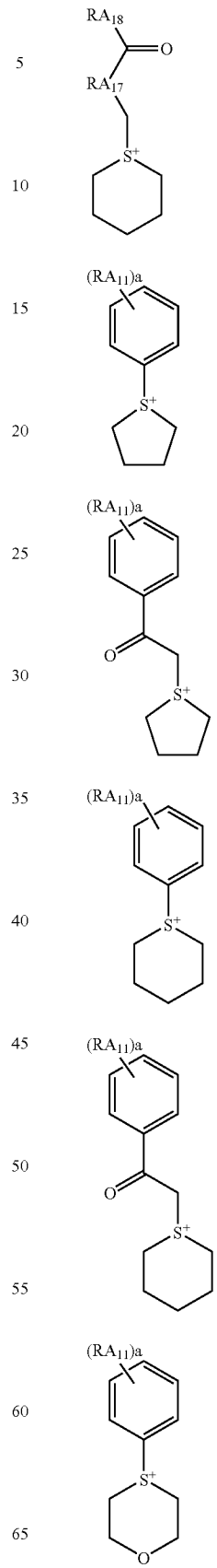

-continued
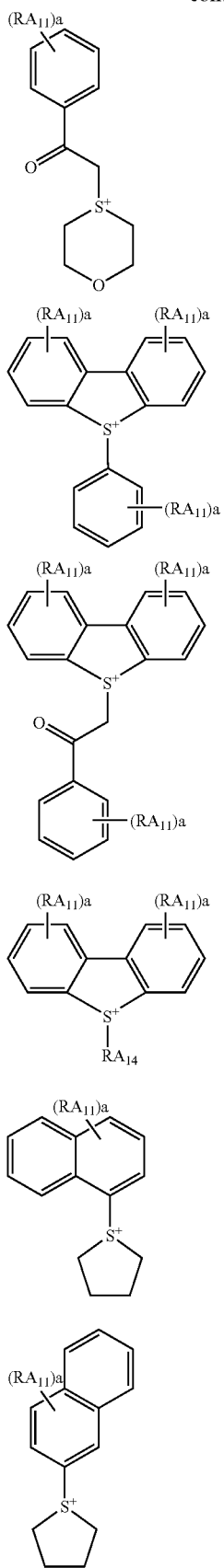
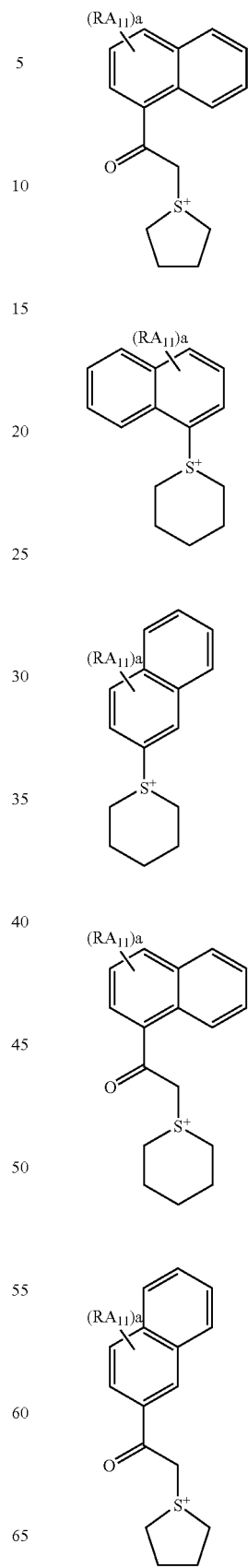

-continued

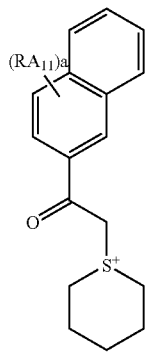

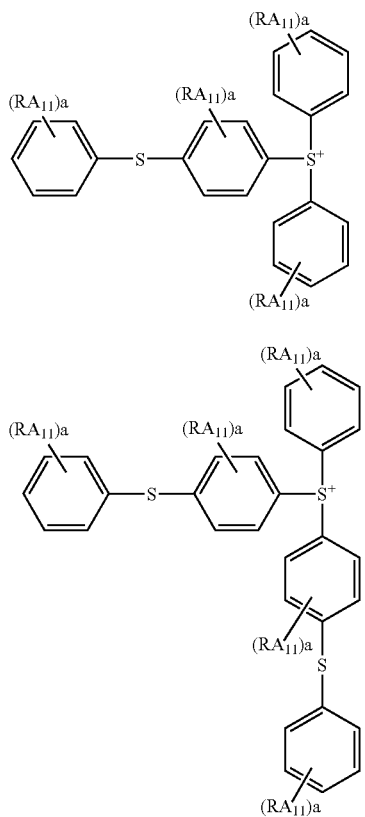

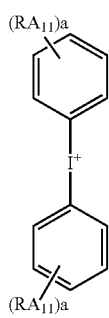

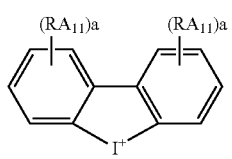

-continued

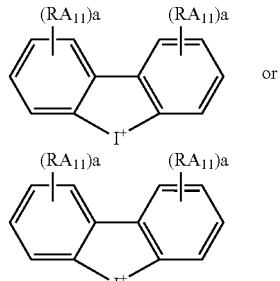

wherein $R^{A11}$, $R^{A12}$, and $R^{A13}$ are, each independently, a hydrogen, halogen, straight, branched or cyclic $C_1$–$C_{20}$ alkyl group, alkoxy group, aryl group, straight, branched or cyclic $C_1$–$C_{20}$ ester group, carbonyl group, or lactone ring-bearing alkyl groups, $R^{A14}$, $R^{A15}$, and $R^{A16}$ are, each independently, a straight, branched or cyclic $C_1$–$C_{10}$ alkyl group, which optionally comprises a carbonyl group, ester group or lactone ring, $R^{A17}$ is methylene, $R^{A18}$ is a straight, branched or cyclic $C_1$–$C_{10}$ alkyl group, or $R^{A17}$ and $R^{A18}$, taken together, optionally forms a ring, and a, b and c are, each independently, an integer of 0 to 5.

20. The resist composition of claim 9, wherein each $R^{01}$ is independently a straight, branched or cyclic alkyl group of 1 to 10 carbon atoms, which may comprise a halogen atom or carbonyl, ester, thioether or ether group, or is an aryl group of 6 to 12 carbon atoms, or an aralkyl group of 7 to 12 carbon atoms.

21. The resist composition of claim 20, wherein the aryl group is phenyl, xylyl, tolyl or naphthyl, and/or the aralkyl group is benzyl, phenylethyl or phenylpropyl.

22. The resist composition of claim 9, wherein the sulfonate anion in formula (3) is a fluoroalkylsulfonic acid having at least one ether bond within the molecule.

23. The resist composition of claim 9, wherein the sulfonate anion in formula (3)

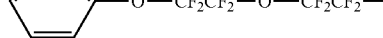
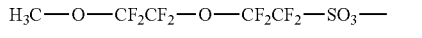
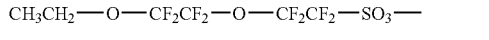
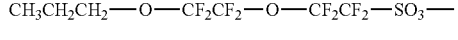
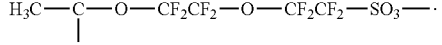

24. The resist composition of claim 9, wherein $Rf^3$ is alkylene.

25. The resist composition of claim 9, wherein the cation part of formula (3) is
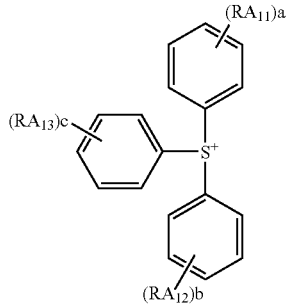
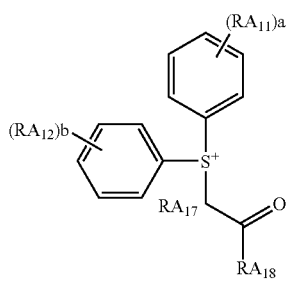
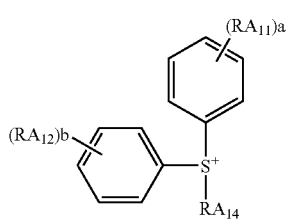
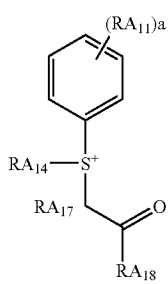
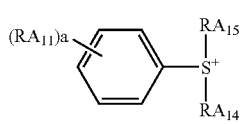
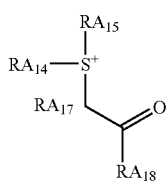
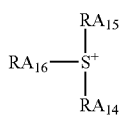
-continued
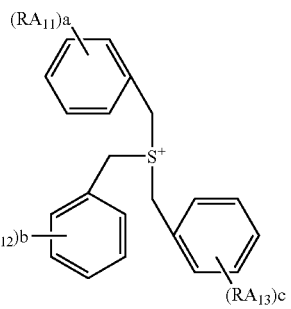
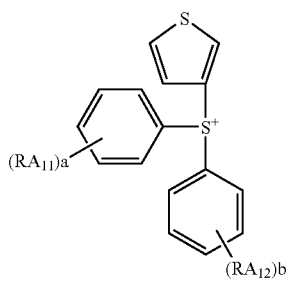
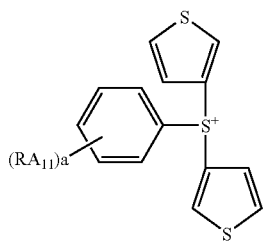
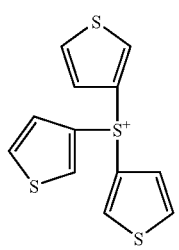
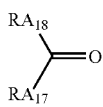
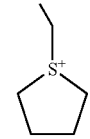
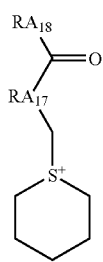

-continued
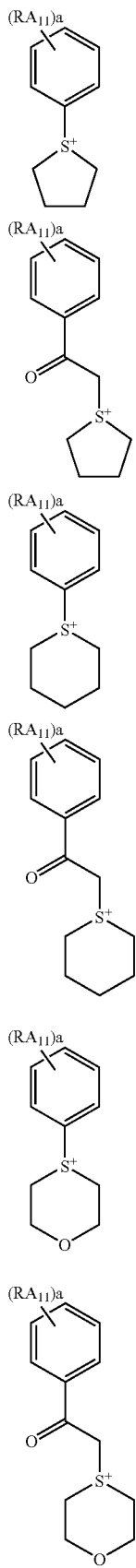
-continued
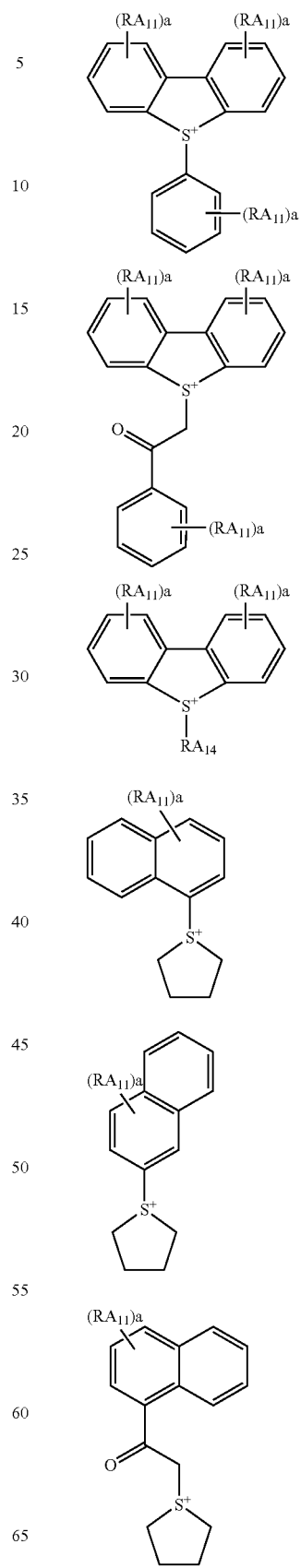

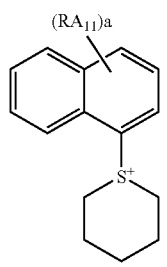
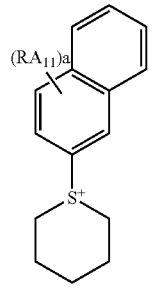
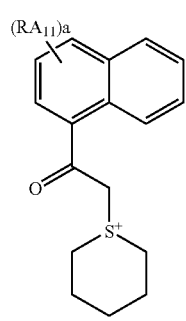
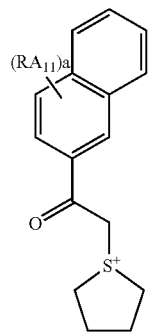
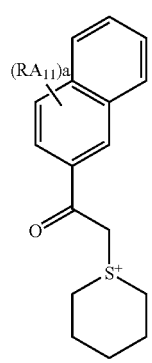
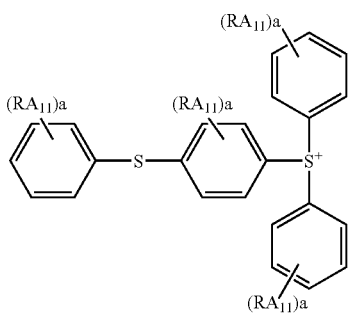
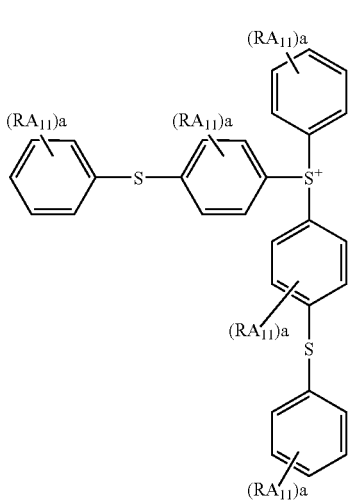
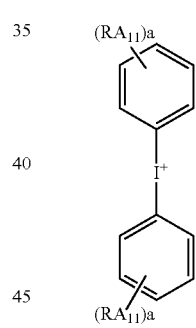
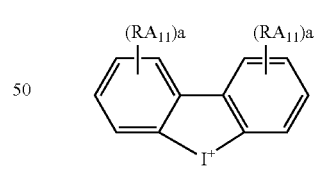
or
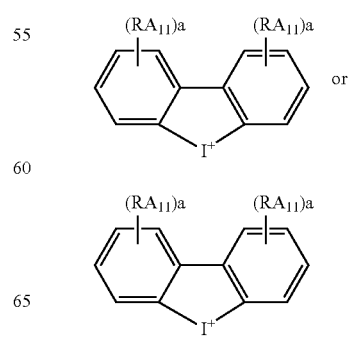

$R^{411}$, $R^{412}$, and $R^{413}$ are, each independently, a hydrogen, halogen, straight, branched or cyclic $C_1$–$C_{20}$ alkyl group, alkoxy group, aryl group, straight, branched or cyclic $C_1$–$C_{20}$ ester group, carbonyl group, or lactone ring-bearing alkyl groups, $R^{414}$, $R^{415}$, and $R^{416}$ are, each independently, a straight, branched or cyclic $C_1$–$C_{10}$ alkyl group, which optionally comprises a carbonyl group, ester group or lactone ring, $R^{417}$ is methylene, $R^{418}$ is a straight, branched or cyclic $C_1$–$C_{10}$ alkyl group, or $R^{417}$ and $R^{418}$, taken together, optionally forms a ring, and a, b and c are, each independently, an integer of 0 to 5.

\* \* \* \* \*